(12) United States Patent
Yeh et al.

(10) Patent No.: US 11,699,631 B2
(45) Date of Patent: Jul. 11, 2023

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Shu-Shen Yeh, Taoyuan (TW); Po-Yao Lin, Hsinchu County (TW); Hui-Chang Yu, Hsinchu County (TW); Shyue-Ter Leu, Hsinchu (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 7 days.

(21) Appl. No.: 17/184,497

(22) Filed: Feb. 24, 2021

(65) Prior Publication Data

US 2022/0270949 A1  Aug. 25, 2022

(51) Int. Cl.
*H01L 23/367* (2006.01)
*H01L 25/065* (2023.01)
*H01L 23/00* (2006.01)

(52) U.S. Cl.
CPC .......... *H01L 23/3675* (2013.01); *H01L 24/16* (2013.01); *H01L 24/32* (2013.01); *H01L 24/73* (2013.01); *H01L 24/81* (2013.01); *H01L 24/83* (2013.01); *H01L 25/0655* (2013.01); *H01L 2224/16227* (2013.01); *H01L 2224/32225* (2013.01); *H01L 2224/73253* (2013.01); *H01L 2924/35121* (2013.01); *H01L 2924/37001* (2013.01)

(58) Field of Classification Search
CPC ...... H01L 23/3675; H01L 24/16; H01L 24/32
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |

(Continued)

*Primary Examiner* — Errol V Fernandes
(74) *Attorney, Agent, or Firm* — JCIPRNET

(57) ABSTRACT

Semiconductor device includes circuit substrate, first semiconductor die, thermal interface material, package lid. First semiconductor die is disposed on and electrically connected to circuit substrate. Thermal interface material is disposed on first semiconductor die at opposite side of first semiconductor die with respect to circuit substrate. Package lid extends over first semiconductor die and is bonded to the circuit substrate. Package lid includes roof, footing, and island. Roof extends along first direction and second direction perpendicular to first direction. Footing is disposed at peripheral edge of roof and protrudes from roof towards circuit substrate along third direction perpendicular to first direction and second direction. Island protrudes from roof towards circuit substrate and contacts thermal interface material on first semiconductor die. Island is disconnected from footing along second direction.

20 Claims, 13 Drawing Sheets

(56) References Cited

U.S. PATENT DOCUMENTS

| | | |
|---|---|---|
| 9,666,502 B2 | 5/2017 | Chen et al. |
| 9,735,131 B2 | 8/2017 | Su et al. |
| 2015/0187679 A1* | 7/2015 | Ho .................. H01L 23/562 |
| | | 438/118 |
| 2020/0395269 A1* | 12/2020 | Dubey .................. H01L 24/83 |

* cited by examiner

SEMICONDUCTOR DEVICE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
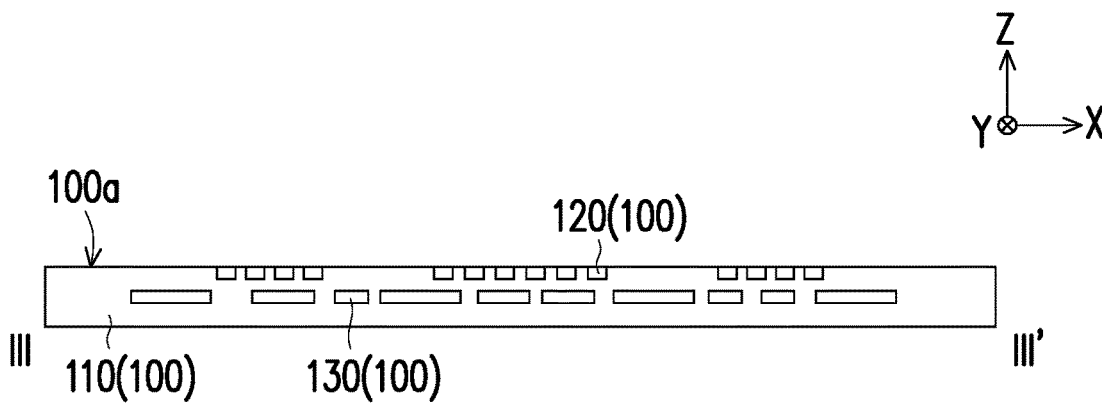
FIG. 1A to FIG. 1F are schematic cross-sectional views of structures produced at various stages of a manufacturing method of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1F are schematic cross-sectional views of structures produced at various stages of a manufacturing method of a semiconductor device SD10 according to some embodiments of the present disclosure. Referring to FIG. 1A, in some embodiments a circuit substrate 100 is provided. In some embodiments, the circuit substrate 100 includes a core dielectric layer 110, contact pads 120 formed at a side 100a of the circuit substrate 100, and conductive traces 130 embedded in the core dielectric layer 110. Solder masks (not shown) may extend on the core dielectric layer 110, and may have openings exposing the contact pads 120.

Figure 1B:
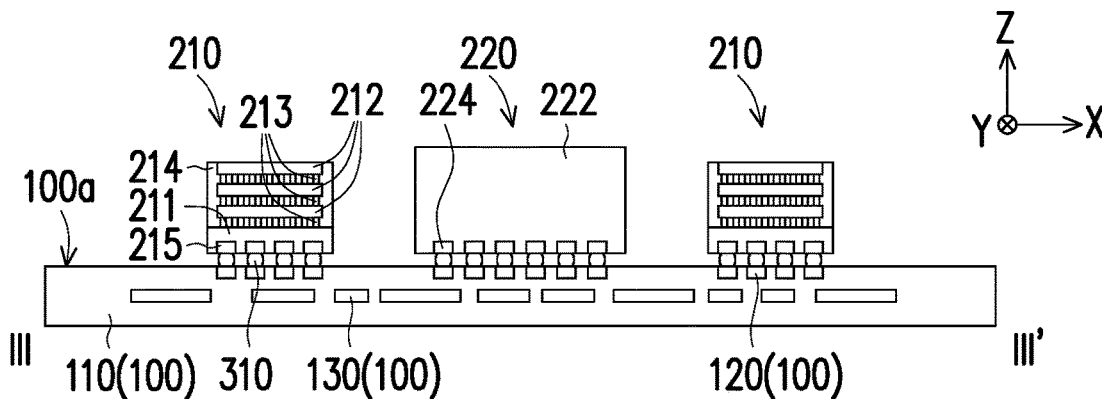

In FIG. 1B, one or more semiconductor dies 210, 220 are connected to the exposed side 100a of the circuit substrate 100. While a certain structure of the semiconductor dies 210, 220 is illustrated in the drawings and described below, the disclosure is not limited thereto, and other structures (e.g., chip scale packages, InFO, PoP, and so on) are contemplated in the disclosure. Furthermore, the semiconductor dies 210, 220 do not need to have similar structures to each other, so that some semiconductor dies 210, 220 may be InFO dies, some others may be chip scale packages, and so on. Similarly, the disclosure does not limit the function for which the semiconductor dies 210, 220 may be configured. For example, the semiconductor dies 210, 220 may be memory dies, such as high-bandwidth memories; logic dies, such as a central processing unit (CPU) die, a graphic processing unit (GPU) die, a micro control unit (MCU) die, an input-output (I/O) die, a baseband (BB) die, or an application processor (AP) die; microelectromechanical systems, such as sensors or the like; chiplets, and so on. In some embodiments, the semiconductor die 220 may be a logic die or a higher-power consumption die, and the semiconductor dies 210 may be memory dies (e.g., DRAM, HMB, or the like) having lower power consumption than the semiconductor die 220.

In some embodiments, a semiconductor die 210 includes a base chip 211, and chips 212 stacked on the base chip 211. The chips 212 may be connected to each other and to the base chip 211 by micro-bumps 213. The chips 211, 212 may include semiconductor substrates having active and/or passive devices formed therein. An encapsulant 214 may be disposed on the base chip 211 to laterally wrap the chips 212 and the micro-bumps 213. A material of the encapsulant 214 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. Conductive pads 215 are formed on the base chip 211, at an opposite side of the base chip 211 with respect to the stacked chips 212. The conductive pads 215 are exposed and available to allow electrical connection to the chips 211, 212 of the semiconductor die 210. In some embodiments, the semiconductor die 220 may be a bare die, including a semiconductor substrate 222 having conductive pads 224 exposed at a front surface of the semiconductor die 220.

In some embodiments, conductive terminals 310 respectively connect the semiconductor dies 210, 220 to the contact pads 120 of the circuit substrate 100. For example, the semiconductor dies 210, 220 may be disposed on the circuit substrate 100 with the conductive pads 215, 224 directed towards the circuit substrate 100. In some embodiments, the conductive terminals 310 are C4-bumps, and the semiconductor dies 210, 220 are flip-chip bonded to the circuit substrate 100. In some embodiments, an underfill (not shown) may be disposed between the semiconductor dies 210, 220 and the circuit substrate 100 to protect the conductive terminals 310 from thermal and mechanical stresses. The underfill may include a resin, such as an epoxy resin or the like, and may be formed, for example, by vacuum underfill or other suitable processes.

Figure 1C:
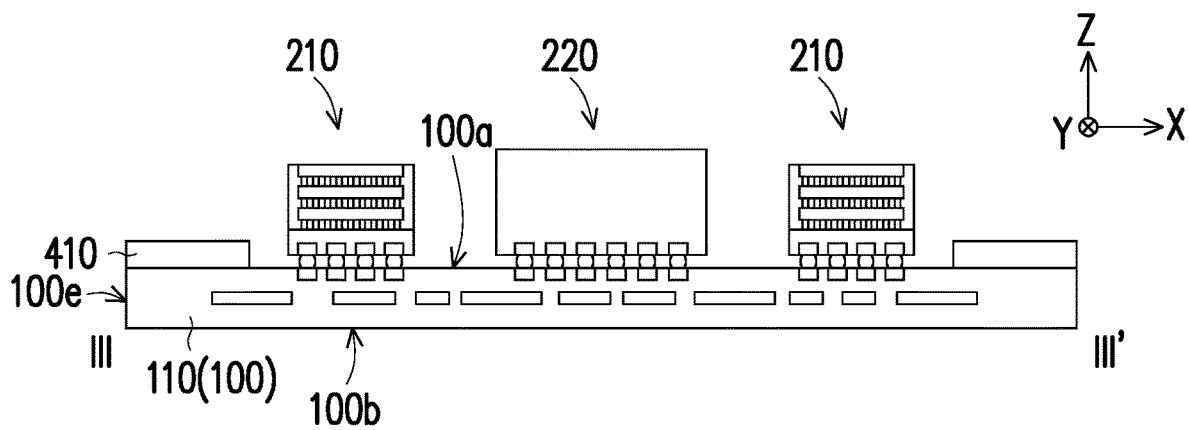

Referring to FIG. 1C, in some embodiments, an adhesive 410 is disposed on the side 100a of the circuit substrate 100, beside the semiconductor dies 210, 220. In some embodiments, the adhesive 410 forms a concentric frame surrounding the semiconductor dies 210, 220. In some embodiments, the adhesive 410 may be disposed in proximity of the outer periphery of the circuit substrate 100. In some embodiments, the adhesive 410 is disposed following the profile of the outer periphery of the circuit substrate 100, for example along an edge 100e of the circuit substrate 100. The edge 100e may be the peripheral surface joining the side 100a where the semiconductor dies 210, 220 are bonded to the opposite side 100b. For example, if the circuit substrate 100 has a rectangular footprint, the adhesive 410 may have the shape of a rectangular frame. Similarly, if the circuit substrate 100 has a circular footprint, the adhesive 410 may have the shape of a circular frame. In some embodiments, multiple portions of adhesive 410 are disposed on the circuit substrate 100 to form the frame. That is, the frame formed by the adhesives 410 may be discontinuous, presenting gaps in which the circuit substrate 100 is exposed in between consecutive portions of adhesive 410. In some embodiments, the adhesive 410 includes a thermocurable adhesive, a photocurable adhesive, a thermally conductive adhesive, a thermosetting resin, a waterproof adhesive, a lamination adhesive, or a combination thereof. In some embodiments, the adhesive 410 includes a metallic layer (not shown) with solder paste (not shown) deposited thereon. According to the type of material used, the adhesive 410 may be formed by deposition, lamination, printing, plating, or any other suitable technique.

Figure 1D:
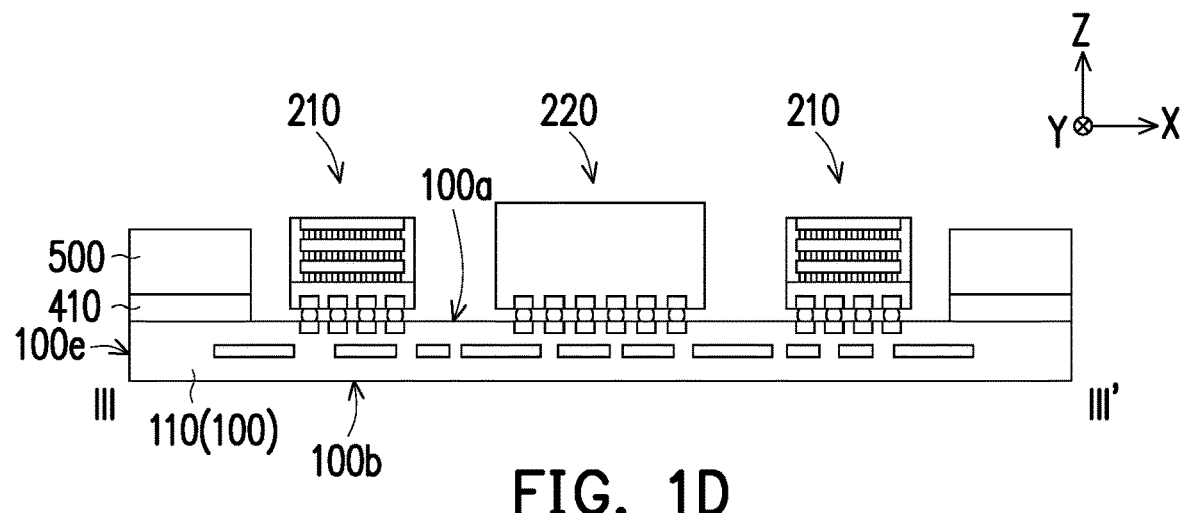

In FIG. 1D, a support ring 500 is bonded to the circuit substrate 100 via the adhesive 410. In some embodiments, the support ring 500 has the shape of a frame encircling the semiconductor dies 210, 220. The support ring 500 may be placed on the circuit substrate 100 in correspondence of the adhesive 410, and bonded to the circuit substrate 100 for example by curing (or pre-curing) the adhesive 410. In some embodiments, the support ring 500 includes any suitable material, such as a metal, a metallic alloy, a semiconductor material or the like. For example, the support ring 500 may include stainless steel, silicon carbide alloy, machinable ceramic, dummy silicon, kovar, invar, molybdenum, copper- or nickel-clad molybdenum, copper-clad Invar, copper tungsten, aluminum, diamond composites, metal diamond alloys (e.g., silver diamond) or a combination thereof.

Figure 1E:
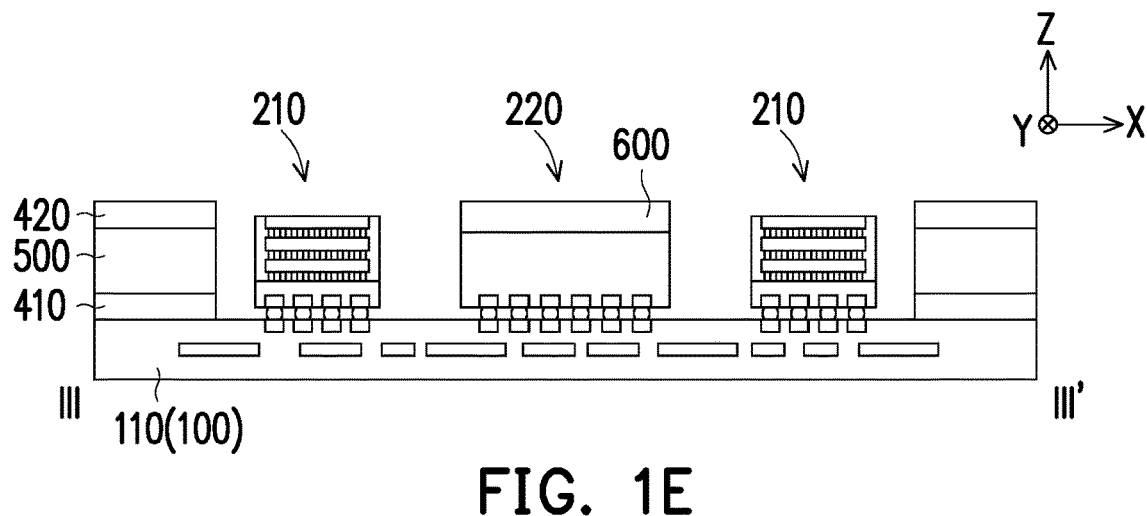

In FIG. 1E, an adhesive 420 is disposed on the support ring 500, in a similar fashion as to what was previously described for the adhesive 410. A thermal interface material 600 is disposed on the semiconductor die 220, and, optionally, on the semiconductor dies 210. In some embodiments, the thermal interface material 600 includes a grease-based material, a phase change material, a gel, an adhesive, a polymeric material, a metallic material, a liquid metal thermal compound, or a combination thereof. In some embodiments, the thermal interface material 600 includes lead-tin based solder (PbSn), silver paste (Ag), gold, tin, gallium, indium, rhodium, zinc or other suitable thermally conductive materials. In some embodiments, the thermal interface material 600 may be a film type material. For example, the thermal interface material 600 may be a sheet of conductive material (e.g., carbon nanotubes, graphene, or graphite) or a composite film with conductive materials such as fillers (e.g., powders, flake shape particles, nanotubes, fibers, etc.) embedded in a base material. In some embodiments, the thermal interface material 600 is a gel type material. According to the type of material used, the thermal interface material 600 may be formed by deposition, lamination, printing, plating, or any other suitable technique.

Figure 1F:
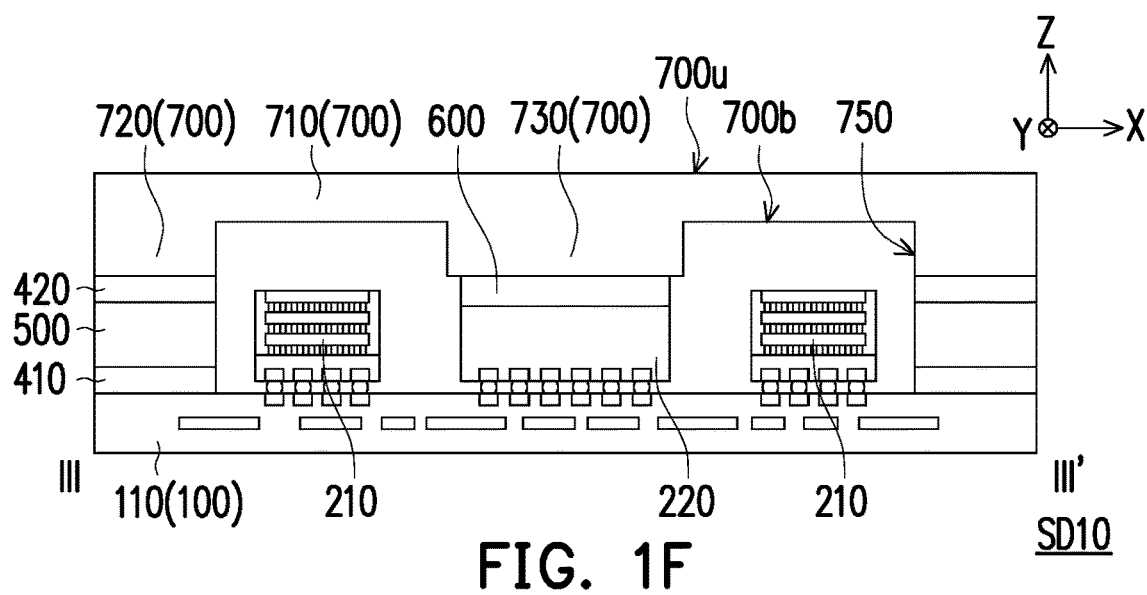

In FIG. 1F, a semiconductor device SD10 is obtained by disposing and bonding a package lid 700 to the circuit substrate 100, via the adhesive 420 and the thermal interface material 600. In some embodiments, the package lid 700 may be aligned on the circuit substrate 100 and disposed on the support ring 500 so as to extend over the semiconductor dies 210, 220. One or more curing processes, optionally applying pressure, may be performed to secure the package lid 700 to the circuit substrate 100. In some embodiments, the package lid 700 may include any suitable material, such as a metal, a metallic alloy, a semiconductor material or the like. For example, the package lid 700 may include stainless steel, silicon carbide alloy, machinable ceramic, dummy silicon, kovar, invar, molybdenum, copper- or nickel-clad molybdenum, copper-clad Invar, copper tungsten, aluminum, diamond composites, metal diamond alloys (e.g., silver diamond) or a combination thereof. In some embodiments, the package lid 700 may include a metallic material such as copper, anodized with a less reactive material, such as nickel. In some embodiments, the package lid 700 may be an integrally formed piece, fabricated, for example, by punching a foil of the corresponding material (e.g., a copper foil).

Figure 2:
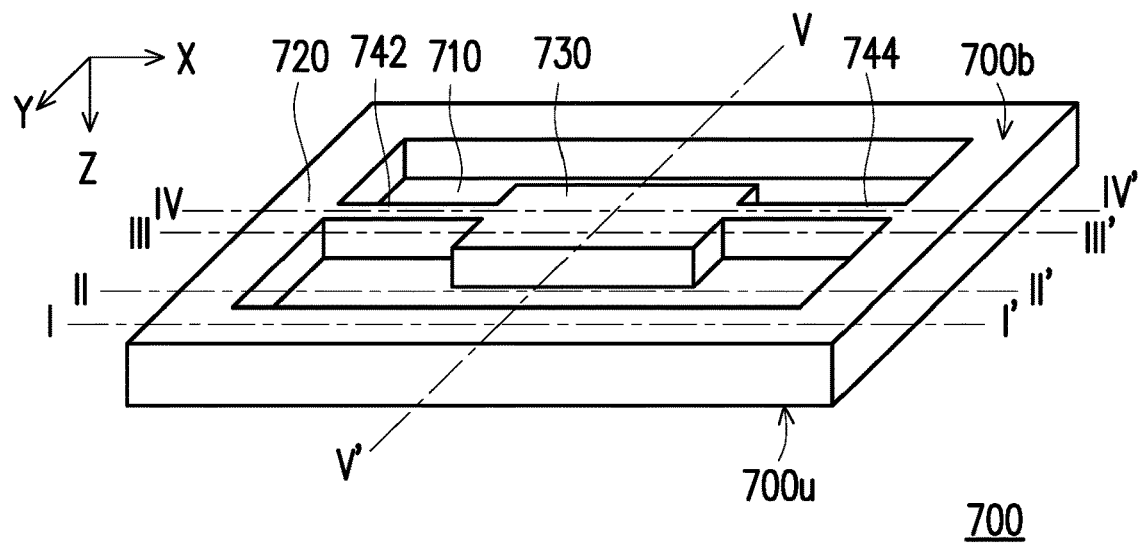
FIG. 2 is a schematic perspective view of a package lid according to some embodiments of the present disclosure.
Figure 3A:
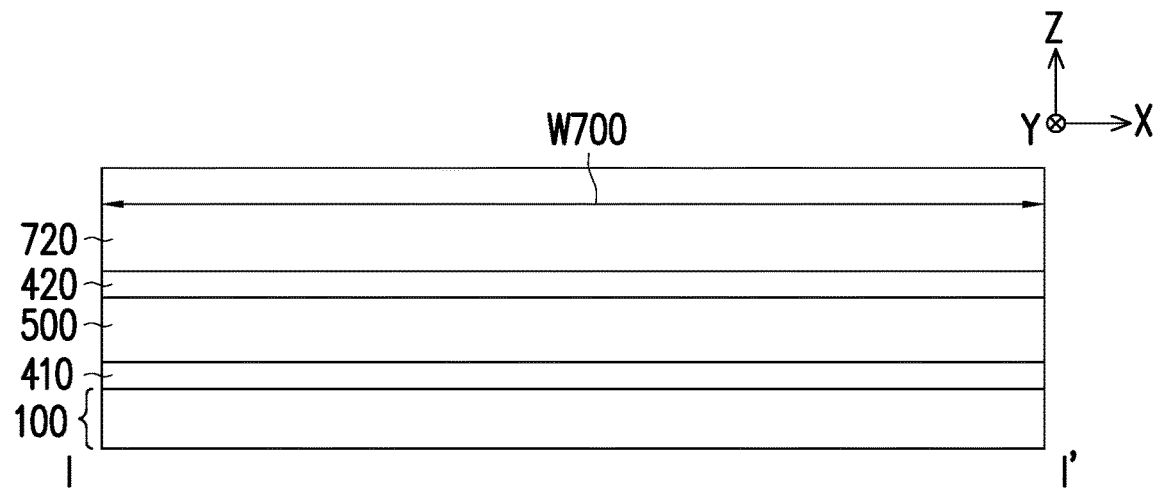
FIG. 3A to FIG. 3E are schematic cross-sectional views of a semiconductor device according to some embodiments of the present disclosure.
Figure 3B:
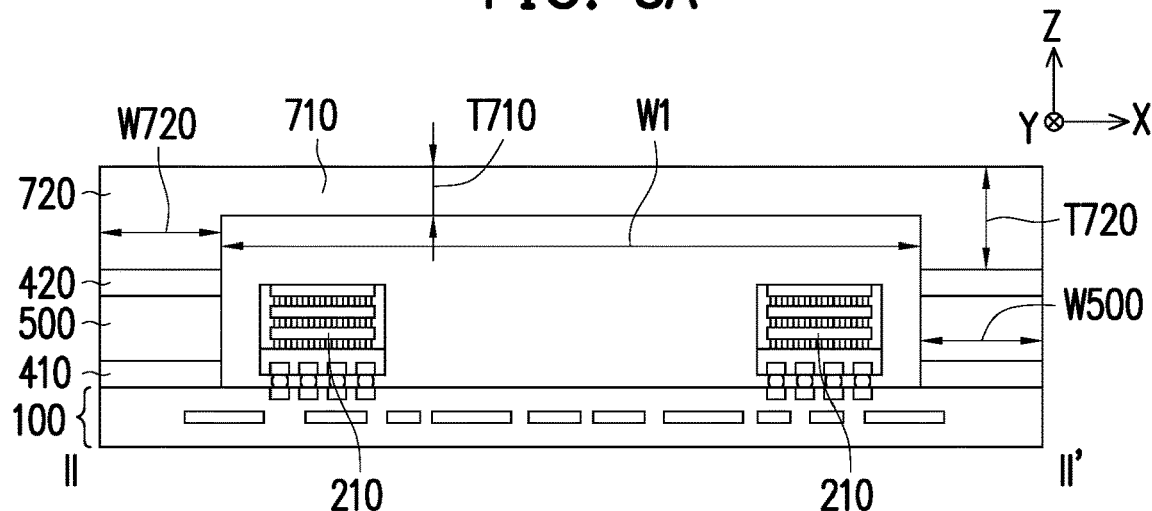
Figure 3C:
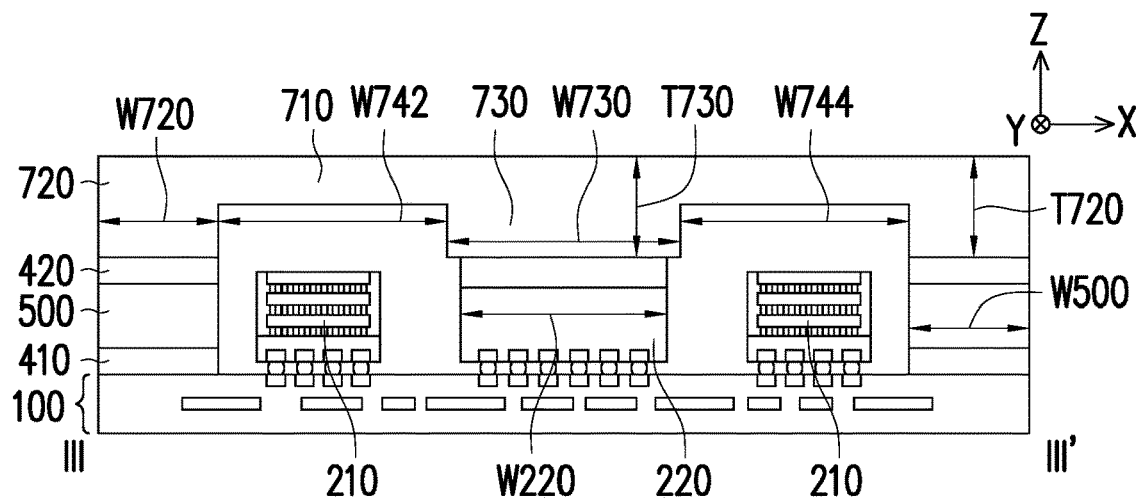
Figure 3D:
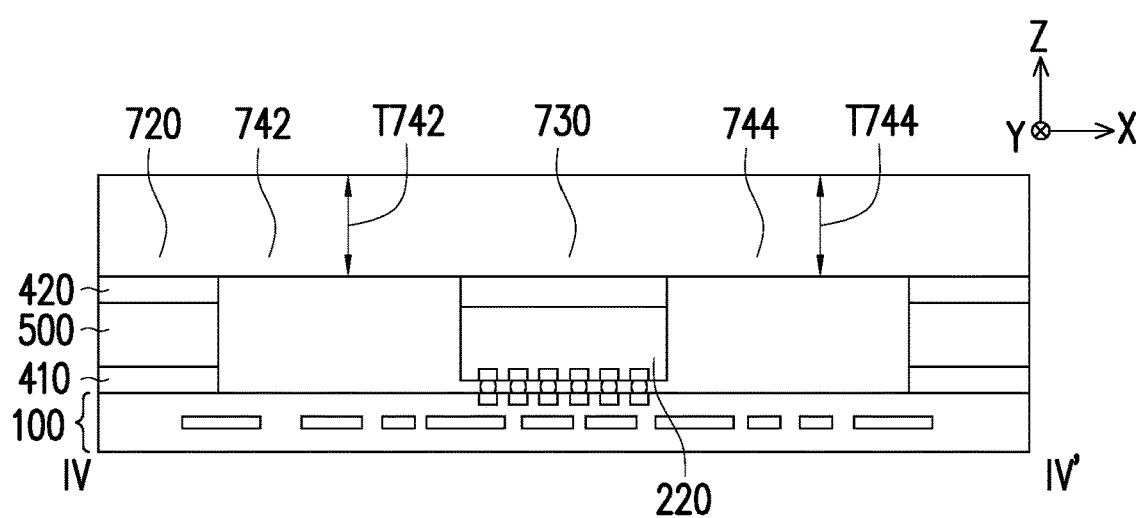
Figure 3E:
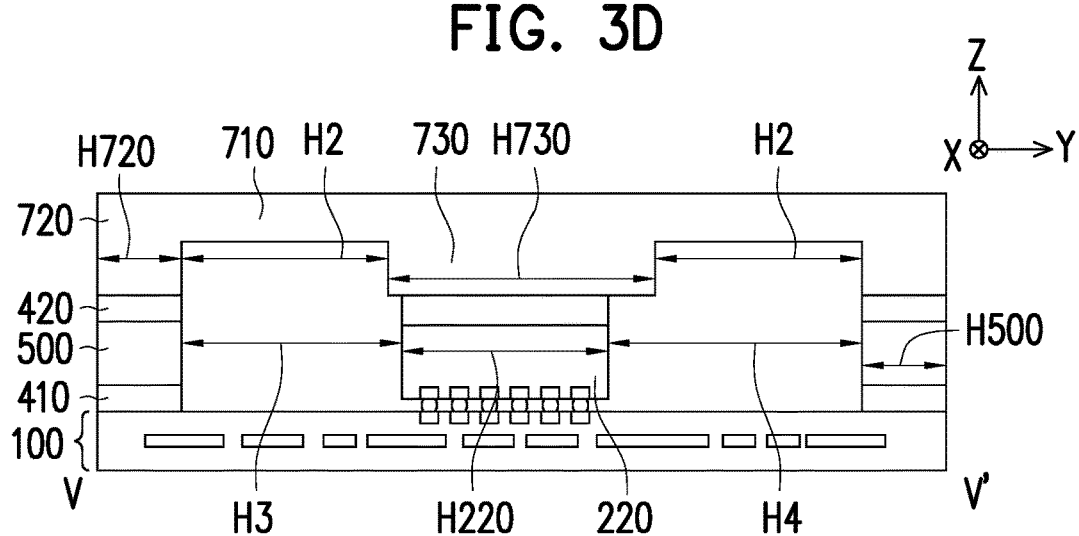
Figure 4A:
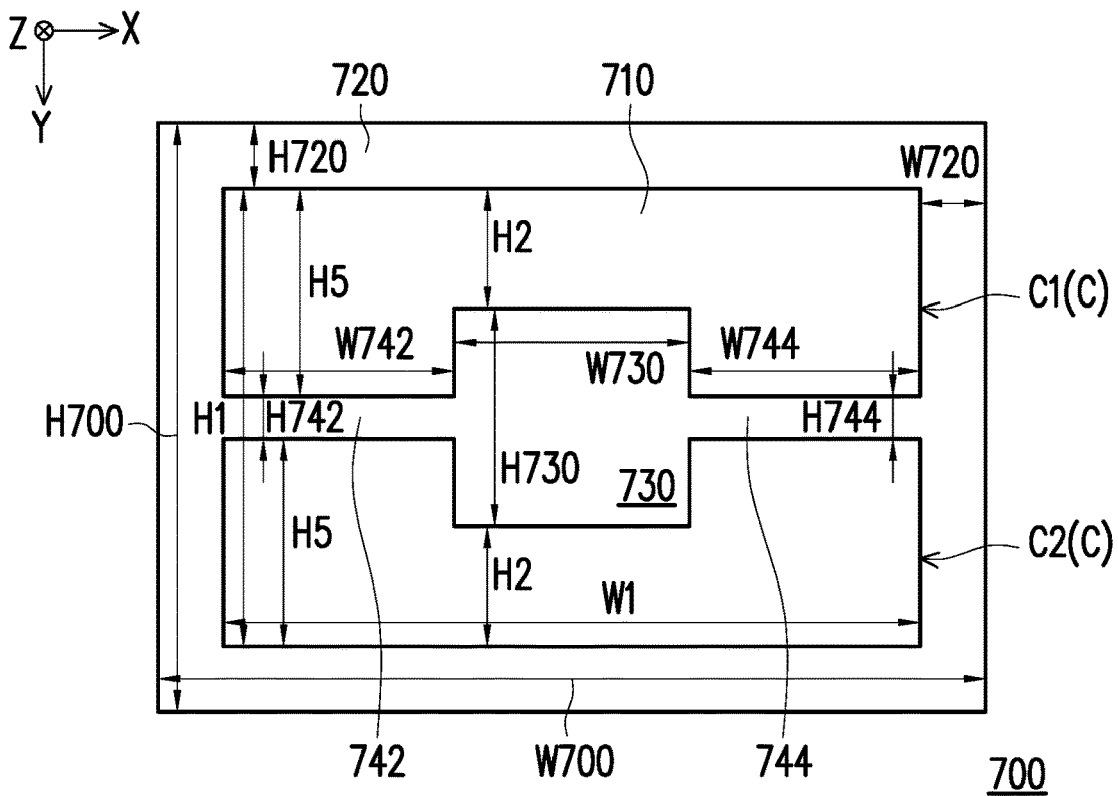
FIG. 4A is a schematic bottom view of a package lid according to some embodiments of the present disclosure.
Figure 4B:
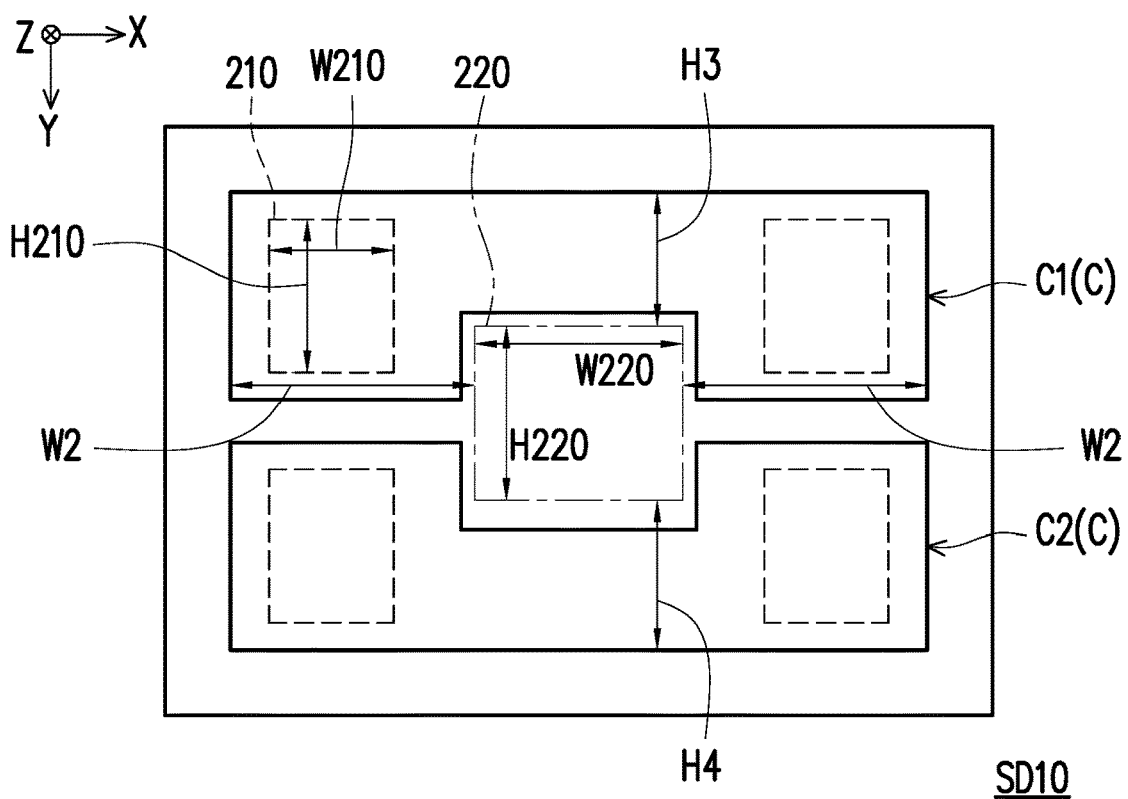
FIG. 4B is a schematic bottom view of a semiconductor device according to some embodiments of the present disclosure.

FIG. 2 is a schematic perspective view of the package lid 700 according to some embodiments of the disclosure. In the view of FIG. 2, the package lid 700 is oriented so that the bottom surface 700b which is directed towards the circuit substrate 100 and the semiconductor dies 210, 220 in the semiconductor device SD10 is visible. That is, the package lid 700 in FIG. 2 has been rotated of 180 degrees around the X direction with respect to FIG. 1F. FIG. 3A to FIG. 3E are schematic cross-sectional views of the semiconductor device SD10 according to some embodiments of the disclosure. The views of FIG. 3A to FIG. 3D are taken in XZ planes respectively located at the level height of the lines I-I', II-II', III-III', and IV-IV' along the Y direction, as illustrated in FIG. 2. The views of FIG. 1A to FIG. 1F have also been taken in the XZ plane located at the level height of the line III-III' along the Y direction. The view of FIG. 3E is taken in a YZ plane located at the level height of the line V-V' along the X direction, as illustrated in FIG. 2. FIG. 4A is a schematic bottom view of the package lid 700 according to some embodiments of the disclosure. FIG. 4B is a schematic bottom view of the semiconductor device SD10 according to some embodiments of the disclosure, illustrating the package lid 700 and the positions of the semiconductor dies 210 (dashed lines) and the semiconductor die 220 (dash-dotted lines). In the following description, dimensions along the X direction will be referred to as widths, dimensions along the Y direction will be referred to as heights, and dimensions along the Z direction will be referred to as thicknesses.

Referring to FIG. 1F to FIG. 4B, in some embodiments, the semiconductor device SD10 may include one semiconductor die 220 and plural (e.g., four) semiconductor dies 210. In some embodiments, the semiconductor dies 210 may be disposed closer to the support ring 500 than the semiconductor die 220. For example, the semiconductor die 220 may be disposed within an area delimited or near at the corners and/or the edges by the semiconductor dies 210. The support ring 500 encircles the area defined by the semiconductor dies 210, and supports the package lid 700 over the circuit substrate 100. In some embodiments, the package lid 700 may have a footprint and a shape substantially matching the footprint and the shape of the circuit substrate 100. For example, the circuit substrate 100 and the package lid 700 may have a rectangular shape, with the width W700 of the package lid 700 being larger than the height H700 of the package lid 700. However, the disclosure is not limited thereto, and other shapes (e.g., square, circular, elliptical, etc.) of the circuit substrate 100 and the package lid 700 are contemplated within the scope of the disclosure.

In some embodiments, the package lid 700 includes a roof 710 extending over the semiconductor dies 210, 220 and a footing 720 disposed at the edge of the roof 710. The footing supports the roof 710 and, at a bottom side, contacts the adhesive 420. The footing 720 has a shape substantially matching the shape of the support ring 500. The thickness T720 of the footing 720 is greater than the thickness T710 of the roof 710, so that the roof 710 is raised with respect to the contact surface of the footing 720 and the adhesive 420. The footing 720 protrudes towards the circuit substrate 100 with respect to the roof 710 at a side of the bottom surface 700b of the package lid 700, defining a concavity C of width W1 and height H1 in correspondence of which the semiconductor dies 210, 220 are disposed. For example, the width W720 and the height H720 of the footing 720 may be substantially equal to the width W500 and height H500 of the support ring, respectively, where the widths W720, W500 and the heights H720, H500 are measured, for example, at level heights along the X direction or Y direction falling within the concavity C defined by the footing 720. In some embodiments, the width W720 or the height H720 of the footing 720 may respectively be up to about 10% of the width W700 or the height H700 of the package lid 700. For example, the width W720 may be about 5% of the width W700, and the height H720 may be about 5% of the height H700. In some embodiments, while the concavity C is formed at the bottom surface 700b of the package lid 700, the opposite upper surface 700u may be substantially flat, for example to facilitate installation of additional components such as heat exchangers (not shown).

In some embodiments, the package lid 700 further includes an island 730 protruding from the roof 710 in correspondence of the semiconductor die 220 (e.g., the semiconductor die producing more heat during usage among the semiconductor dies 210, 220), contacting the thermal interface material 600 on the semiconductor die 220. In some embodiments, the thickness T730 of the island 730 is greater than the thickness T710 of the roof, and may be about equal to the thickness T720 of the footing 720. For the sake of simplicity, in the present disclosure the thickness of the package lid 700 in correspondence of the footing 720 is referred to as a thickness T720 of the footing 720, the thickness of the package lid 700 in correspondence of the island 730 is referred to as a thickness T730 of the island 730, and the thickness of the package lid 700 where neither the island 730 nor the footing 720 are formed is referred to as a thickness T710 of the roof 710.

In some embodiments, the island 730 at least fully covers the semiconductor die 220. In some embodiments, the island 730 laterally protrudes with respect to the semiconductor die 220, along one or both of the X direction and the Y direction. So, for example, the width W220 and the height H220 of the semiconductor die 220 are at most respectively equal to the width W730 and the height H730 of the island 730. In some embodiments, the width W220 and the height H220 of the semiconductor die 220 are smaller than the width W730 and the height H730 of the island 730, respectively. In some embodiments, the height H730 of the island may be about in the range from 55% to 80% of the height H700 of the package lid 700, for example, may be about 65% of the height H700. In some embodiments, the width W730 of the island 730 may be about in the range from 20% to 50% of the width W700, for example may be about 35% of the width W700. In some embodiments, having the island 730 fully covering the semiconductor die 220 ensures effective thermal exchange between the semiconductor die 220 and the island 730, thus facilitating dissipation of heat generated by the semiconductor die 220 during usage.

In some embodiments, the island 730 is detached at least along one direction from the footing 720 of the package lid 700. For example, the island 730 may be detached from the longer side of the footing 720 of the package lid 700 (e.g., the side extending along the X direction in FIG. 2 and FIG. 4A). That is, a distance (height) H2 may exists on both sides of the island 730 along the Y direction between the island 730 and the footing 720. So, the package lid 700 has a thinner portion formed by the roof 710 of thickness T710 interposed along the Y direction between thicker portions formed by the island 730 of thickness T730 and the footing 720 of thickness T720. For example, proceeding along the Y direction at the level height of the line V-V' (or at any other level height along the Y direction passing through the island 730), concave portions of height H2 separate the footing 720 from the island 730 on both sides of the island 730. In some embodiments, each one of the heights H2 may independently be about in the range from 5% to 15% of the height H700 of the package lid 700. For example, each height H2 may be about 10% of the height H700. In some embodiments, by detaching the island 730 from the footing 720, mechanical stress experienced at the level of the adhesive 420 may be reduced, for example of about 20% compared with a case in which the island 730 is connected along the direction of the short side of the package lid 700 (e.g., Y direction) to the footing 720. Therefore, the semiconductor device SD10 may have increased resistance to mechanical stress and delamination.

Figure 4C:
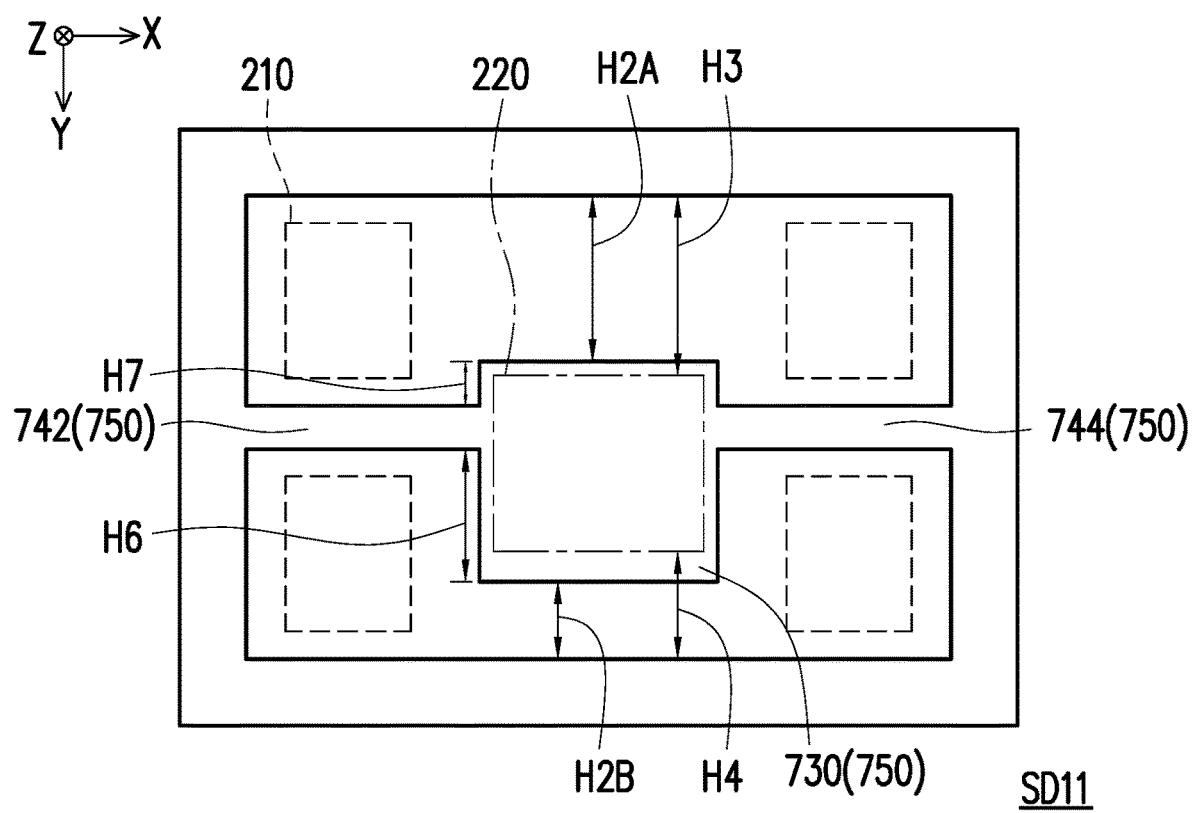
FIG. 4C is a schematic bottom view of a semiconductor device according to some embodiments of the present disclosure.

In some embodiments, the heights H2 may be equal to each other, and the island 730 may be disposed at about a central area of the package lid 700 along the Y direction. However, the disclosure is not limited thereto, and, in some alternative embodiments, package lids 750 may be used in which the heights H2A, H2B at two sides of the island 730 are different, for example with the height H2A being greater than the height H2B, as illustrated for the semiconductor device SD11 in FIG. 4C. That is, the island 730 may be eccentric with respect to the package lid 700 and the circuit substrate 100. As illustrated in FIG. 4C, in some embodiments, the ribs 742, 744 may also be eccentric with respect to the island 730, for example with the height H6 (the distance between the level height of the edge of the ribs 742, 744 and the edge of the island 730) being greater than the height H7 (the distance between the level height of the edge of the ribs 742, 744 and the edge of the island 730, the edges considered for the height H7 being opposite with respect to the edges considered for the height H6).

In some embodiments, the semiconductor die 220 may be eccentric with respect to the package lid 700 and the circuit substrate 100. That is, the distance (height) H3 of the semiconductor die 220 from the footing 720 at one side of the semiconductor die 220 along the Y direction may be smaller than the distance (height) H4 of the semiconductor die 220 from the footing 720 at the other side of the semiconductor die 220 along the Y direction. For example, additional devices (such as surface mount devices, not shown) may be connected to the circuit substrate 100 on the side of the larger height H4. In some embodiments, the heights H3 and H4 may independently be between 1 to 1.5 times the height H730 of the island 730. In some embodiments, the distances (widths) W2 between the semiconductor die 220 and the footing 720 at either side of the semiconductor die 220 along the X direction may be about equal to each other, and may be slightly larger than the width W730 of the island 730.

In some embodiments, the island 730 is detached from the (longer) edges of the footing 720 (the edges extending along the X direction in FIG. 2), but may be connected by one or more ribs 742, 744 to the other (shorter) edges of the footing 720 (the edges extending along the Y direction in FIG. 2). For example, the rib 742 may extend from the island 730 to the footing 720 along the X direction on one side of the island 730, and the rib 744 may extend from the island 730 to the footing 720 along the X direction at an opposite side of the island 730 with respect to the rib 742. In some embodiments, the ribs 742, 744 extend in between pairs of semiconductor dies 210. For example, on one side of the island 730 along the X direction, a semiconductor die 210 may be disposed on one side of the rib 742 along the Y direction and another semiconductor die 210 may be disposed on an opposite side of the rib 742 along the Y direction; on an opposite side of the island 730 along the X direction, a semiconductor die 210 may be disposed on one side of the rib 744 along the Y direction and another semiconductor die 210 may be disposed on an opposite side of the rib 744 along the Y direction.

In some embodiments, the thicknesses T742, T744 of the ribs 742, 744 may be substantially equal to the thicknesses T730 of the island 730 and T720 of the footing 720. That is, the footing 720, the island 730, and the ribs 742, 744 may all protrude to a similar extent from the roof 710. In some embodiments, the ribs 742, 744 and the island 730 may divide the concavity C defined by the footing 720 in two concavities C1, C2, with one concavity C1 located on one side along the Y direction with respect to the ribs 742, 744 and the island 730 and the other concavity C2 located at an opposite side along the Y direction with respect to the ribs 742, 744 and the island 730. In some embodiments, the ribs 742, 744 have a smaller extension along the Y direction than the island 730. For example, the heights H742, H744 of the ribs 742, 744 may independently be about 5% to 15% of the height H730 of the island 730, such as about 9% of the height H730. In some embodiments, the heights H742, H744 of the ribs 742, 744 may independently be about in the range from 3% to 13% of the height H700 of the package lid 700, for example about 6% of the height H700. In some embodiments, the heights H742, H744 of the ribs 742, 744 may be about in the range from 10% to 100% of the height H220 of the semiconductor die 220.

In some embodiments, the widths W742, W744 of the ribs 742, 744 along the X direction may independently be about in the range from 20% to 40% of the width W700 of the package lid 700, and/or about 25% to 45% of the width W1 of the concavity C defined by the footing 720. For example, the widths W of the ribs 742, 744 may be about 30% of the width W1 or about 25% of the width W700. In some embodiments, a ratio of each one of the widths W742, W744 to the width W730 of the island 730 may be about in the range from 0.85 to 1.1, for example about 0.95. In some embodiments, the widths W742, W744 may be selected as a function of the widths W210 of the adjacent semiconductor dies 210. For example, the rib 742 may extend in between a pair of semiconductor dies 210, and a ratio of the width W210 to the width W742 may be about in the range from 0.8 to 0.9, for example about 0.85. Similarly, the position of the ribs 742, 744 along the Y direction with respect to the footing 720 may be independently determined as a function of the height H210 of the adjacent semiconductor dies 210. For example, the distances (heights) H5 between the rib 742 and the footing 720 may be selected so that a ratio of the height H220 of an adjacent semiconductor die 210 to the height H5 is about in a range from 0.90 to 0.99, for example about 0.96. In some embodiments, each one of the height H5 may independently be about in the range from 30% to 50% of the height H700. In some embodiments, the ribs 742, 744 may enhance the structural rigidity of the package lid 700 and, consequently, of the semiconductor device SD10. By doing so, warpage of the semiconductor device SD10 may be effectively reduced.

Figure 5:
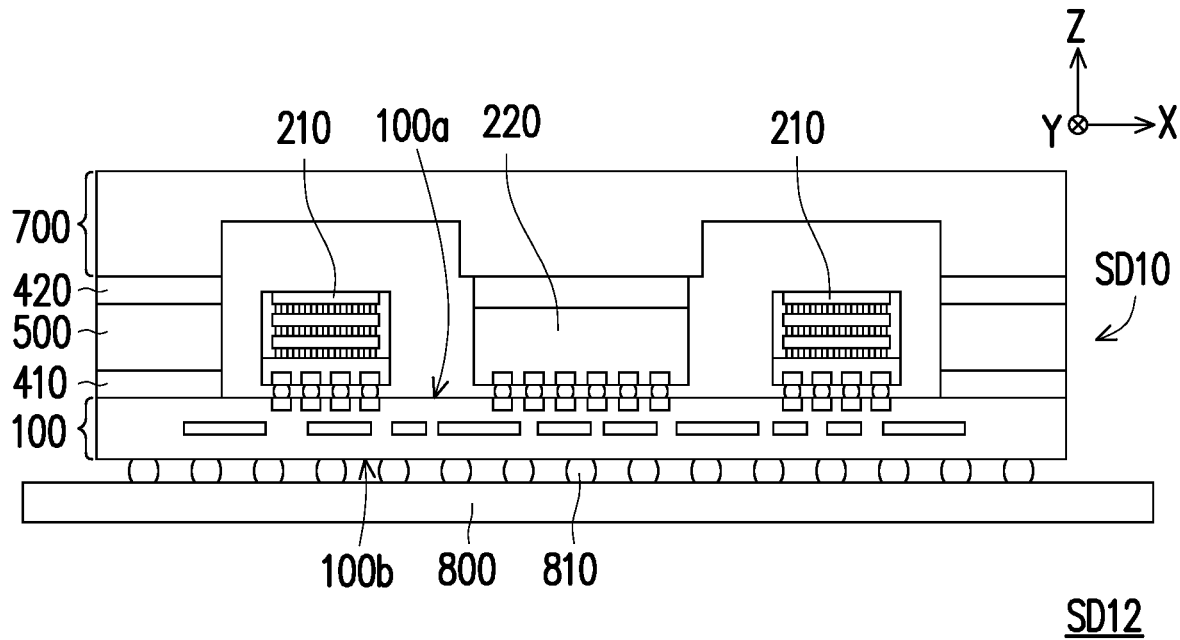
FIG. 5 is a schematic cross-sectional view of a semiconductor device according to some embodiments of the present disclosure.

In FIG. 5 is illustrated the semiconductor device SD10 integrated in a larger semiconductor device SD12, according to some embodiments of the disclosure. For example, the semiconductor device SD10 may be connected to a circuit board 800 by connective terminals 810. The connective terminals 810 may be installed on the side 100b of the circuit substrate 100 opposite to the side 100a to which the semiconductor dies 210, 220 are bonded. In some embodiments, the connective terminals 810 are solder balls for ball grid array mounts. In some embodiments, the connective terminals 810 are electrically connected to the semiconductor dies 210, 220 via the circuit substrate 100. In some embodiments, the connective terminals 810 may be used to integrate the semiconductor device SD10 with other components, such as the circuit board 800. It should be noted that while in the following disclosure the semiconductor devices may be presented without including connective terminals or being integrated in larger devices, the disclosure also includes embodiments in which these additional components are included and integration in larger devices is contemplated for all of the semiconductor devices presented herein. Similarly, if a semiconductor device is illustrated including additional components such as the connective terminals, the disclosure also includes embodiments in which the additional components are not included. Unless otherwise specified, the description of structures, materials and processes given above for the components of the semiconductor device SD10 applies to corresponding components of the other semiconductor devices of the disclosure.

Figure 6:
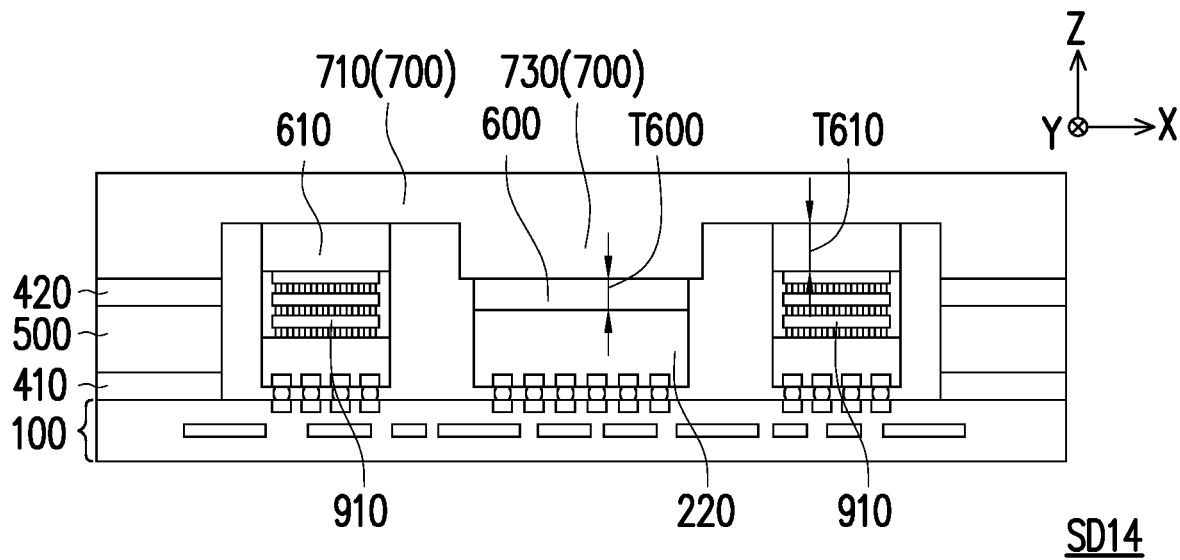
FIG. 6 is a schematic cross-sectional view of a semiconductor device according to some embodiments of the present disclosure.

FIG. 6 is a schematic cross-sectional view of a semiconductor device SD14 according to some embodiments of the disclosure. The semiconductor device SD14 may have a similar structure and be fabricated following similar processes as previously described for the semiconductor device SD10 illustrated, e.g., in FIG. 1F. In some embodiments, the semiconductor device SD14 includes the circuit substrate 100 and semiconductor dies 910, 220 connected to the circuit substrate 100. The semiconductor dies 910 may be similar to the semiconductor dies 210 (illustrated, e.g., in FIG. 1F), and may be disposed over the circuit substrate 100 in locations corresponding to the ones illustrated for the semiconductor dies 210 with respect to FIG. 4B. The semiconductor device SD14 further includes the support ring 500 connected to the circuit substrate 100 by the adhesive 410, and the package lid 700 bonded to the support ring 500 by the adhesive 420. A difference between the semiconductor device SD10 and the semiconductor device SD14 lies in that additional thermal interface material 610 is disposed on the semiconductor dies 910, so that the package lid 700 contacts not only the thermal interface material 600 on top of the semiconductor die 220, but also the thermal interface material 610 on top of the semiconductor dies 910. In some embodiments, the thickness T610 of the thermal interface material 610 may be selected according to the dimensions of the semiconductor dies 910. In some embodiments, the thickness T610 of the thermal interface material 610 on the semiconductor dies 910 may be greater than the thickness T600 of the thermal interface material 600 on the semiconductor die 220, for example because the semiconductor die 220 is disposed in correspondence of the island 730, while the roof 710 overlies the semiconductor dies 910. In some embodiments, the thermal exchange between the semiconductor dies 910 and the package lid 700 may be enhanced, so that heat generated during usage of the semiconductor device SD14 may be effectively dissipated—for example by additional heat exchangers (not illustrated) which may be mounted on the package lid 700. It should be noted that the additional thermal interface material 610 may be applied to any one of the semiconductor devices of the disclosure.

Figure 7A:
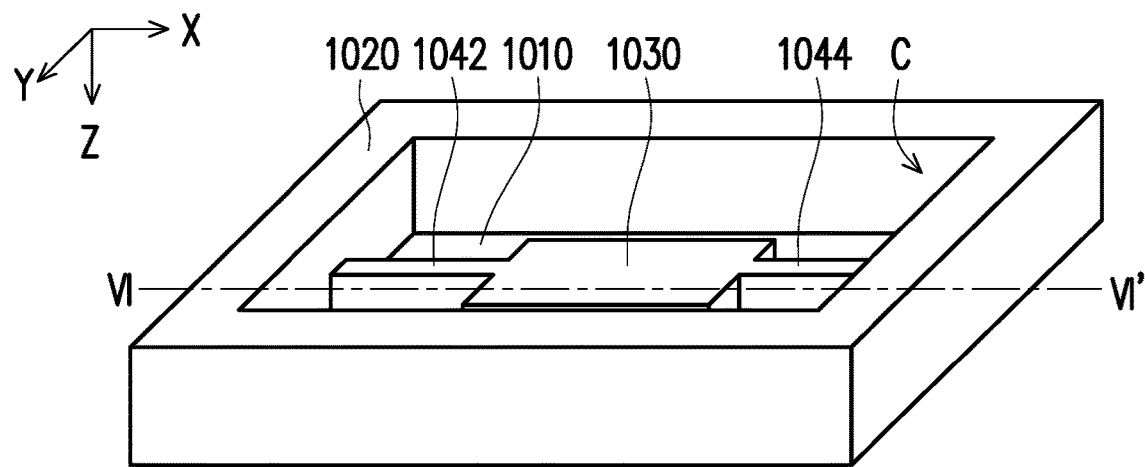
FIG. 7A is a schematic perspective view of a package lid according to some embodiments of the present disclosure.
Figure 7B:
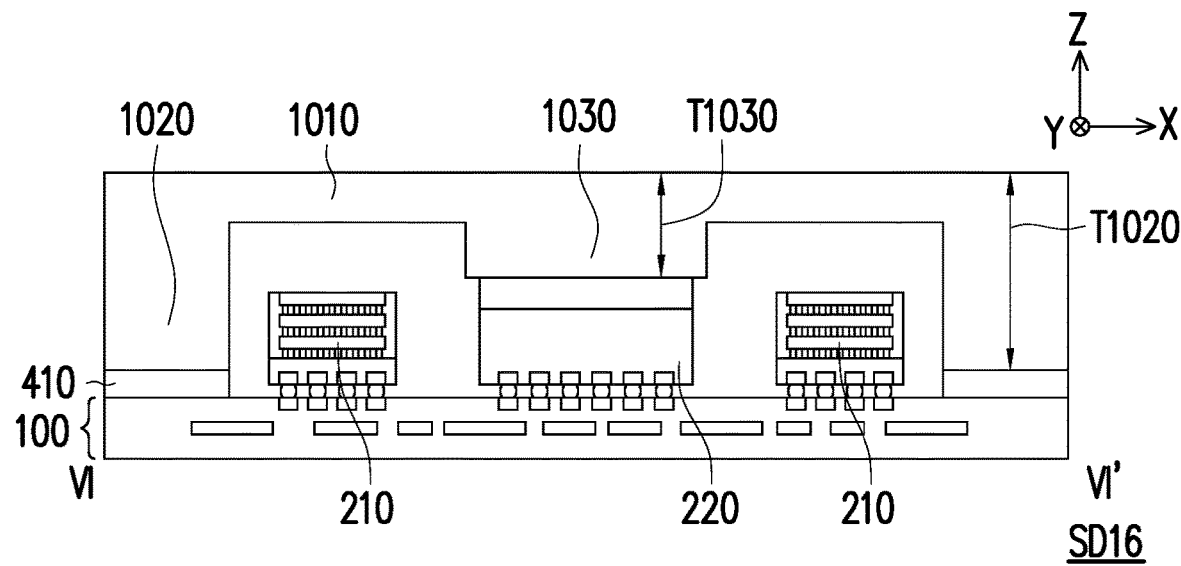
FIG. 7B is a schematic cross-sectional view of a semiconductor device according to some embodiments of the disclosure.

FIG. 7A is a schematic perspective view of a package lid 1000 according to some embodiments of the disclosure. The view of FIG. 7A is taken from a point of view corresponding to the point of the view of FIG. 2. FIG. 7B is a schematic cross-sectional view of a semiconductor device SD16 including the package lid 1000 according to some embodiments of the disclosure. The cross-sectional view of FIG. 7B is taken in an XZ plane located at the level height of the line VI-VI' along the Y direction. Referring to FIG. 7A and FIG. 7B, the semiconductor device SD16 may have a similar structure and be fabricated following a similar process as the semiconductor device SD10 of FIG. 1F. A difference between the semiconductor device SD10 and the semiconductor device SD16 may lie in the fact that the footing 1020 of the package lid 1000 extends all the way to contact the adhesive 410 disposed on the circuit substrate 100. That is, the thickness T1020 of the footing 1020 is such that the support ring 500 and the adhesive 420 (both illustrated in FIG. 1F) may be omitted, thus simplifying the manufacturing process of the semiconductor device SD16. The thickness T1020 of the footing is greater than the thickness T1030 of the island 1030, so that the island 1030 and the ribs 1042, 1044 are disposed at the bottom of the concavity C encircled by the footing 1020, protruding from the roof 1010. The semiconductor dies 210, 220 are also disposed within the concavity C, encircled by the footing 1020. The island 1030 and the ribs 1042, 1044 may be formed of the same thickness (e.g., the thickness T1030). It should be noted that all the package lids of the disclosure may be formed with thicker footings as illustrated for the package lid 1000 of FIG. 7A, and assembled to the corresponding circuit substrates 100 without an intervening support ring (such as the support ring 500 of FIG. 1F, for example).

Figure 8:
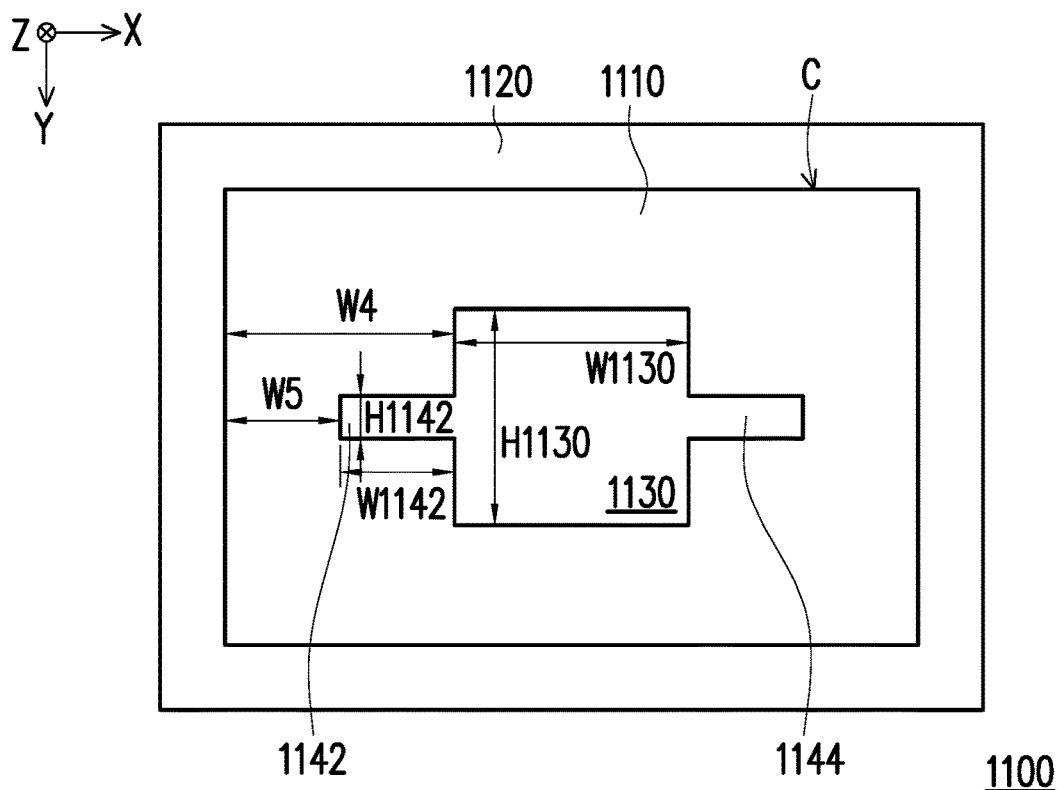
FIG. 8 is a schematic bottom view of a package lid according to some embodiments of the disclosure.

FIG. 8 is a schematic bottom view of a package lid 1100 which may be used in any one of the semiconductor devices of the present disclosure, in place of the corresponding package lids (e.g., the package lid 700 of FIG. 4A). The package lid 1100 may have a similar structure to the package lid 700, comprising a roof 1110, a footing 1120 disposed at the edge of the roof 1110 and protruding from the roof 1110 to define the concavity C, and an island 1130 and ribs 1142, 1144 disposed at a central area of the roof 1110 and protruding in a same direction of the footing 1120. The ribs 1142, 1144 are disposed at opposite sides of the island 1130, extending from the island 1130 towards the footing 1120 along the direction of the largest dimension of the package lid 1100 (e.g., along the X direction). In the package lid 1100, the ribs 1142, 1144 are disconnected from the footing 1120. Taking as an example the rib 1142 (the corresponding description applies for the rib 1144), the width W1142 of the rib 1142 may be smaller than the distance (width) W4 separating the island 1130 from the footing 1120 along the X direction. In some embodiments, the island 1130 has larger extension along the X direction than the ribs 1142, 1144. For example, the width W1130 of the island 1130 is larger than the width W1142 of the rib 1142. In some embodiments, the ratio of the width W1142 of the rib 1142 to the distance (width) W5 between the end of the rib 1142 and the footing 1120 may be in the range from 0.1 to 0.9. Other dimensional relationships (e.g., between the height H1142 of the rib 1142 and the height H1130 of the island 1130, and so on) may be the same as previously described for the package lid 700. In some embodiments, by detaching the ribs 1142, 1144 from the footings 1120, additional space (e.g., corresponding to the width W5) may be created to allow for increased flexibility in the positioning of the semiconductor dies or to mount additional devices (e.g., surface mount devices) on the circuit board over which the package lid 1100 is disposed.

Figure 9:
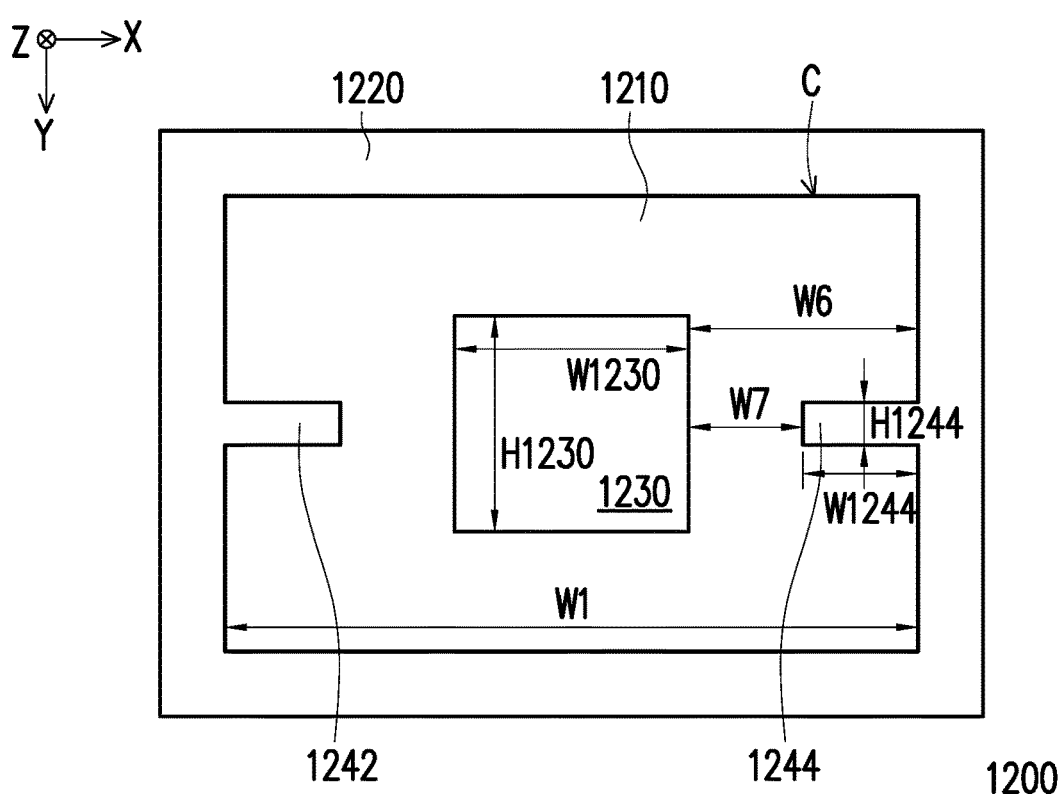
FIG. 9 is a schematic bottom view of a package lid according to some embodiments of the disclosure.

FIG. 9 is a schematic bottom view of a package lid 1200 which may be used in any one of the semiconductor devices of the present disclosure, in place of the corresponding package lids (e.g., the package lid 700 of FIG. 4A). The package lid 1200 may have a similar structure to the package lid 700, including a roof 1210, a footing 1220 disposed at the edge of the roof 1210 and protruding from the roof 1210 to define a concavity C, and an island 1230 and ribs 1242, 1244 disposed at a central area of the roof 1210 and protruding in a same direction of the footing 1220. The ribs 1242, 1244 are disposed at opposite sides of the island 1130, extending from the footing 1220 towards the island 1230 along the largest dimension of the package lid 1200 (e.g., along the X direction). In the package lid 1200, the ribs 1242, 1244 are disconnected from the island 1230. Taking as an example the rib 1244 (the corresponding description applies for the rib 1242), the width W1244 of the rib 1244 may be smaller than the distance (width) W6 separating the island 1230 from the footing 1220 along the X direction. In some embodiments, the island 1230 has larger extension along the X direction than the ribs 1242, 1244. For example, the width W1230 of the island 1230 is larger than the width W1244 of the rib 1244. In some embodiments, the ratio of the distance (width) W7 between the end of the rib 1244 and the island 1230 to the width W1244 of the rib 1244 may be in the range from 0.1 to 0.9. Other dimensional relationships (e.g., between the height H1244 of the rib 1244 and the height H1230 of the island 1230, and so on) may be the same as previously described for the package lid 700. In some embodiments, by detaching the ribs 1242, 1244 from the island 1130, additional space (e.g., corresponding to the width W7) may be created to allow for increased flexibility in the positioning of the semiconductor dies or to mount additional devices (e.g., surface mount devices) on the circuit board over which the package lid 1200 is disposed.

Figure 10:
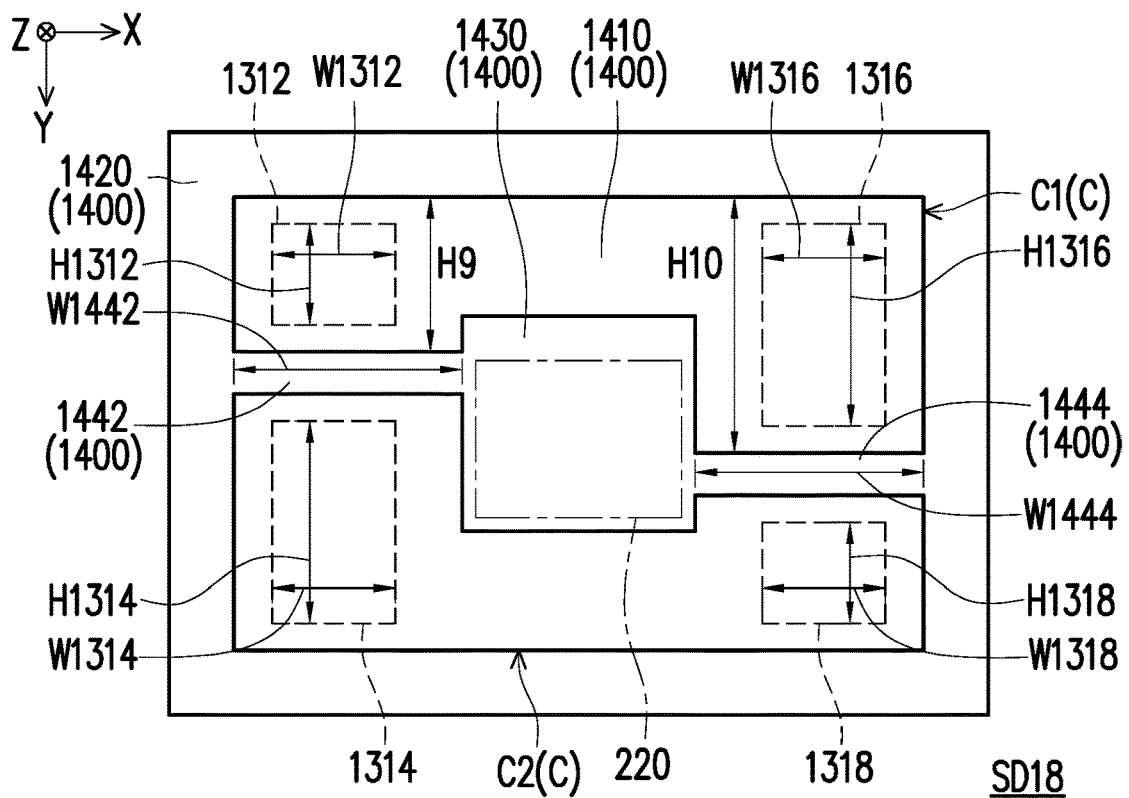
FIG. 10 to FIG. 14 are schematic bottom views of a semiconductor device according to some embodiments of the disclosure.

FIG. 10 is a schematic bottom view of a semiconductor device SD18 according to some embodiments of the disclosure. The semiconductor device SD18 may have a similar structure and be fabricated following similar processes as previously described for the semiconductor device SD10 of FIG. 1F. In some embodiments, the semiconductor device SD18 includes semiconductor dies 1312, 1314, 1316, 1318 having different footprints with respect to each other. The semiconductor dies 1312, 1314, 1316, 1318 may have similar structures and be selected from similar options as previously described for the semiconductor dies 210 (illustrated, e.g., in FIG. 1F). The semiconductor device SD18 further includes a circuit substrate (not illustrated) to which the semiconductor dies 1312, 1314, 1316, 1318, 220 are connected, and a package lid 1400 extending over the semiconductor dies 1312, 1314, 1316, 1318, 220. The package lid 1400 may be connected to the circuit substrate either directly (as the package lid 1000 of FIG. 7B), or via a support ring (as the package lid 700 of FIG. 1F). In the schematic bottom view of FIG. 10, the position of the semiconductor die 220 is illustrated as a dash-dotted line, the positions of the semiconductor dies 1312, 1314, 1316, 1318 are illustrated as dashed lines, and the shape of the package lid 1400 is illustrated with thick solid lines.

The package lid 1400 may have a similar structure to the package lid 700 of FIG. 4B, including a roof 1410, a footing 1420 disposed at the edge of the roof 1410 and protruding from the roof 1410 to define a concavity C, and an island 1430 and ribs 1442, 1444 disposed at a central area of the roof 1410 and protruding in a same direction of the footing 1420 from the roof 1410. The ribs 1442, 1444 are located at opposite sides of the island 1430, extending from the island 1430 to the footing 1420. Together with the island 1430, the ribs 1442, 1444 divide the concavity C in two concavities C1, C2 in correspondence of which the semiconductor dies 1312, 1314, 1316, 1318 are disposed. Dimensional relationships between the island 1430 and the ribs 1442, 1444 may be as previously described for the package lid 700 of FIG. 4A.

In some embodiments, the level height of the ribs 1442, 1444 along the Y direction may be selected according to the dimensions of the semiconductor dies 1312, 1314, 1316, 1318. For example, the semiconductor dies 1312, 1314 may be disposed on a same side along the X direction with respect to the island 1430, and at opposite sides along the Y direction with respect to the rib 1442. For example, the semiconductor die 1312 may be located in the concavity C1, and the semiconductor die 1314 may be located in the concavity C2. The semiconductor dies 1312, 1314 may have similar widths W1312, W1314 but different heights H1312, H1314. For example, the height H1314 of the semiconductor die 1314 may be larger than the height H1312 of the semiconductor die 1312. In some embodiments, the distance (height) H9 between the rib 1442 and the footing 1420 may be set so that a ratio of the height H1312 of the semiconductor die 1312 to the height H9 is about in a range from 0.90 to 0.99, for example about 0.96. A similar relationship may hold on the opposite side of the rib 1442 with respect to the height H1314 of the semiconductor die 1314. That is, the position of the rib 1442 may be off-centered with respect to the island 1430. Furthermore, the ribs 1442, 1444 may be located at different level height along the Y direction with respect to each other. For example, on an opposite side of the island 1430 with respect to the semiconductor dies 1312, 1314, the semiconductor dies 1316, 1318 may be respectively located in the concavities C1 and C2, at opposite sides with respect to the rib 1444. The semiconductor die 1316 may have a larger height H1316 than the height H1318 of the semiconductor die 1318. The distance (height) H10 between the footing 1420 and the rib 1444 may be selected so that a ratio of the height H1316 of the semiconductor die 1316 to the height H10 is about in a range from 0.90 to 0.99, for example about 0.96. The widths W1316, W1318 of the semiconductor dies 1316, 1318 may be similar to each other. It will be apparent that while in FIG. 10 the ribs 1442, 1444 are illustrated with respective widths W1442, W1444 sufficient to extend from the footing 1420 to the island 1430, the disclosure is not limited thereto. In some alternative embodiments, the ribs 1442, 1444 may be detached from the footing 1420 as illustrated, for example, for the package lid 1100 of FIG. 8. In some yet alternative embodiments, the ribs 1442, 1444 may be detached from the island as illustrated, for example, for the package lid 1200 of FIG. 9.

Figure 11:
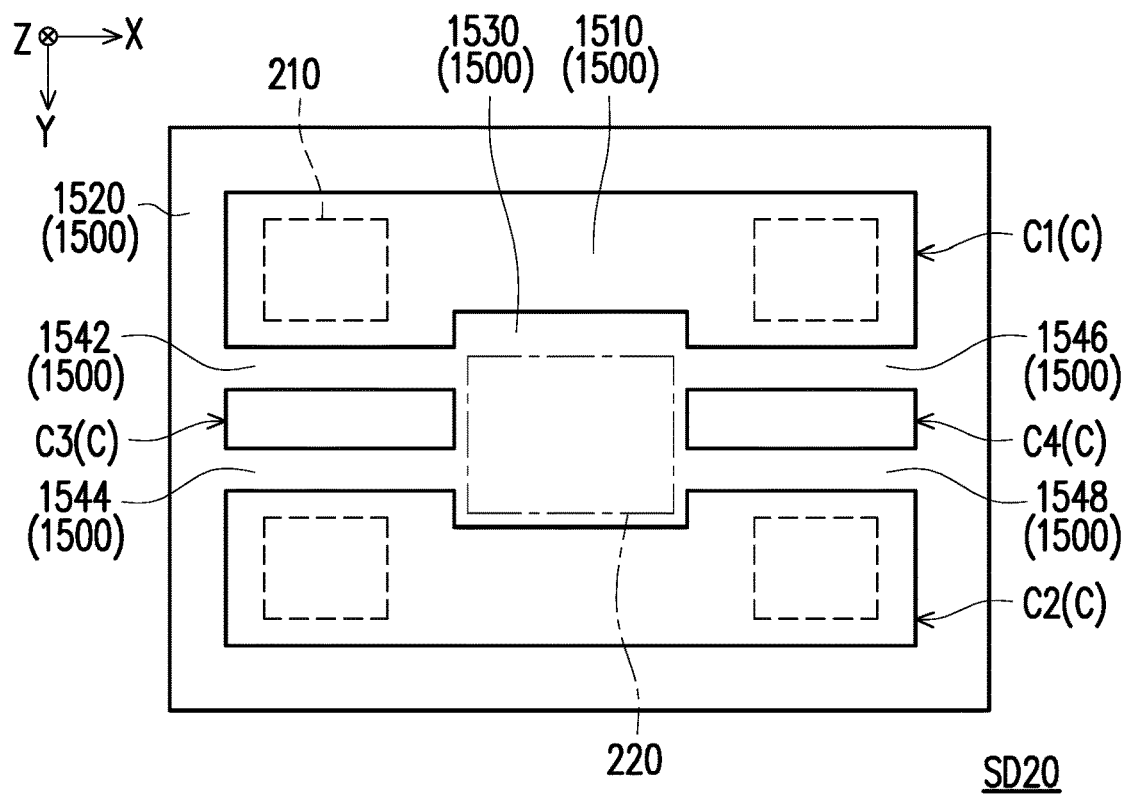

FIG. 11 is a schematic bottom view of a semiconductor device SD20 according to some embodiments of the disclosure. The semiconductor device SD20 may have a similar structure and be fabricated following similar processes as previously described for the semiconductor device SD10 of FIG. 1F. In some embodiments, the semiconductor device SD20 includes the semiconductor dies 210 and 220 bonded to a circuit substrate (such as the circuit substrate 100 of FIG. 1F, not illustrated in FIG. 11), and the package lid 1500 extending over the semiconductor dies 210, 220. The package lid 1500 may be connected to the circuit substrate either directly (as the package lid 1000 of FIG. 7B), or via a support ring (as the package lid 700 of FIG. 1F). In the schematic bottom view of FIG. 11, the position of the semiconductor die 220 is illustrated as a dash-dotted line, the positions of the semiconductor dies 210 are illustrated as dashed lines, and the shape of the package lid 1500 is illustrated with thick solid lines. The package lid 1500 may have a similar structure to the package lid 700 of FIG. 4B, including a roof 1510, a footing 1520 disposed at the edge of the roof 1510 and protruding from the roof 1510 to define a concavity C, and an island 1530 and ribs 1542, 1544, 1546, 1548 disposed at a central area of the roof 1510 and protruding in a same direction of the footing 1520 from the roof 1510. Dimensional relationships between the island 1530 and the ribs 1542, 1544, 1546, 1548 may be as previously described for the package lid 700 of FIG. 4A. The ribs 1542, 1544, 1546, 1548 are located in pairs at opposite sides of the island 1530, extending from the island 1530 to the footing 1520. For example, the ribs 1542, 1544 may be located on one side of the island 1530 at different level heights along the Y direction, connecting the island 1530 to the footing 1520, and the ribs 1546, 1548 may be located at an opposite side of the island 1530 with respect to the ribs 1542, 1544. In some embodiments, the rib 1542 may be located at a same level height along the Y direction as the rib 1546, and the rib 1548 may be located at a same level height along the Y direction as the rib 1544, but the disclosure is not limited thereto. In some alternative embodiments, the ribs 1542, 1544, 1546, 1548 disposed at opposite sides of the island 1530 may be misaligned along the Y direction with respect to each other, as previously discussed for the package lid 1400 with reference to FIG. 10.

Together with the island 1530, the ribs 1542, 1544 divide the concavity C in concavities C1-C4. For example, the ribs 1542, 1546 and the island 1530 form the concavity C1 in which two of the semiconductor dies 210 are disposed at opposite sides along the X direction with respect to the island 1530. The ribs 1542 and 1544 form the concavity C3 on one side (along the X direction) of the island 1530, and the ribs 1546, 1548 form the concavity C4 on an opposite side along the X direction of the island 1530 with respect to the concavity C3. The ribs 1544 and 1548 form the concavity C2 at an opposite side along the Y direction of the island 1530 with respect to the concavity C1. The other semiconductor dies 210 may be disposed in the concavity C2. In some embodiments, the inclusion of multiple ribs 1542, 1544, 1546, 1548 on one or both sides of the island 1530 may enhance the structural stability of the package lid 1500 (and, hence, of the semiconductor device SD20). In some embodiments, the space of the concavities C3, C4 may be used to connect additional devices (e.g., surface mount devices, not illustrated) to the circuit substrate (not illustrated). It will be apparent that while in FIG. 11 the ribs 1542, 1544, 1546, 1548 are illustrated as extending from the footing 1520 to the island 1530, the disclosure is not limited thereto. In some alternative embodiments, some or all of the ribs 1542, 1544, 1546, 1548 may be detached from the footing 1520 as illustrated, for example, for the package lid 1100 of FIG. 8. In some yet alternative embodiments, some or all of the ribs 1542, 1544, 1546, 1548 may be detached from the island 1530 as illustrated, for example, for the package lid 1200 of FIG. 9.

Figure 12:
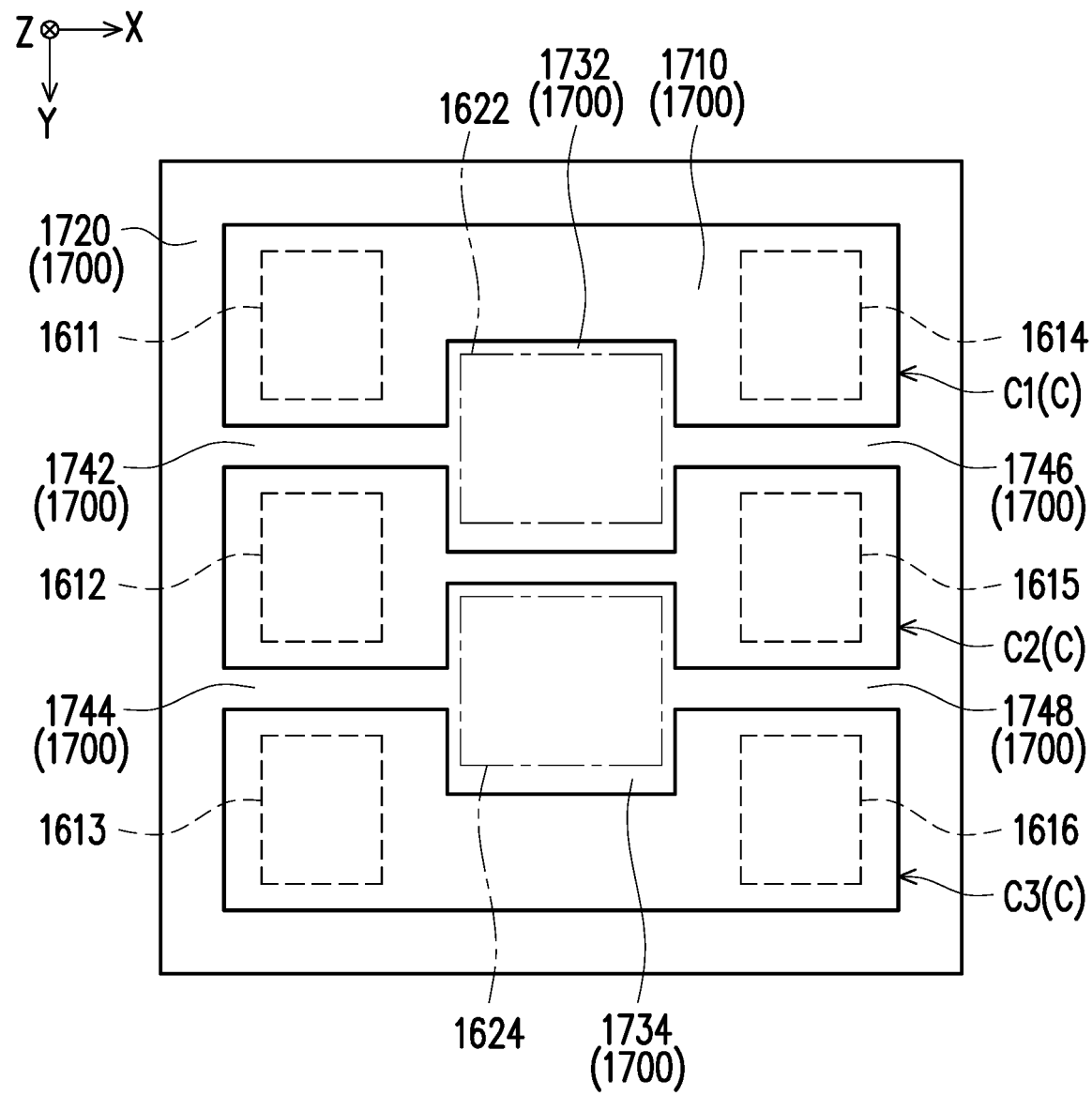

FIG. 12 is a schematic bottom view of a semiconductor device SD22 according to some embodiments of the disclosure. The semiconductor device SD22 may have a similar structure and be fabricated following similar processes as previously described for the semiconductor device SD10 of FIG. 1F. In some embodiments, the semiconductor device SD22 includes semiconductor dies 1611-1616 which may have similar structure and functions as the semiconductor dies 210 of FIG. 1F, and semiconductor dies 1622, 1624 which may have similar structures and functions as the semiconductor dies 220 of FIG. 1F. For example, the semiconductor dies 1622, 1624 may have higher power consumption during usage than the semiconductor dies 1611-1616. The semiconductor dies 1611-1616, 1622, 1624 may be bonded to a circuit substrate (such as the circuit substrate 100 of FIG. 1F, not illustrated in FIG. 12), and the package lid 1700 may be connected to the circuit substrate and extend over the semiconductor dies 1611-1616, 1622, 1624. The package lid 1700 may be connected to the circuit substrate either directly (as the package lid 1000 of FIG. 7B), or via a support ring (as the package lid 700 of FIG. 1F). In the schematic bottom view of FIG. 12, the positions of the semiconductor dies 1622, 1624 are illustrated as dash-dotted lines, the positions of the semiconductor dies 1611-1616 are illustrated as dashed lines, and the shape of the package lid 1700 is illustrated with thick solid lines. The package lid 1700 may have a similar structure to the package lid 700 of FIG. 4B, including a roof 1710, a footing 1720 disposed at the edge of the roof 1710 and protruding from the roof 1710 to define a concavity C, and islands 1732, 1734 and ribs 1742, 1744, 1746, 1748 disposed at a central area of the roof 1710 and protruding in a same direction of the footing 1720 from the roof 1710. The islands 1732, 1734 respectively overlay the semiconductor dies 1622, 1624. Dimensional relationships between the islands 1732, 1734 and the corresponding semiconductor dies 1622, 1624 and the ribs 1742, 1744, 1746, 1748 may be as previously described with respect to the package lid 700 of FIG. 4A.

In some embodiments, the ribs 1742, 1746 are connected at opposite sides of the island 1732, and the ribs 1744, 1748 are connected at opposite sides of the island 1734. In some embodiments, the ribs 1742, 1744, 1746, 1748 extend from the corresponding island 1732 or 1734 to the footing 1720. Together with the islands 1732, 1734, the ribs 1742, 1744, 1746, 1748 divide the concavity C into the concavities C1, C2, C3. The semiconductor dies 1611-1616 may be disposed in correspondence of the concavities C1-C3. For example, the concavity C1 is formed by the footing 1720, and the island 1732 with its ribs 1742, 1746. The semiconductor dies 1611, 1614 are disposed within the concavity C1, at opposite sides of the island 1732 along the X direction, and on a same side of the island 1732 and the ribs 1742, 1746 along the Y direction. The concavity C2 is formed by the footing 1720 along the X direction, and by the island 1732 with its ribs 1742, 1746 and the island 1734 with its ribs 1744, 1748 along the Y direction. That is, the concavity C2 separates along the Y direction the islands 1732, 1734 and the corresponding ribs 1742, 1744, 1746, 1748. In some embodiments, the concavity C2 includes larger areas at opposite sides of the islands 1732, 1734 along the X direction in correspondence of which the semiconductor dies 1612, 1615 are located, and a narrower area which separates the two islands 1732, 1734. The concavity C3 is formed by the island 1734 with its ribs 1744, 1748 on one side along the Y direction, and by the footing 1720 on the remaining sides. The semiconductor dies 1613, 1616 are disposed in the concavity C3 at opposite sides along the X direction with respect to the island 1734.

As illustrated by the semiconductor device SD22 of FIG. 12, the disclosure is not limited by the number of semiconductor dies 1622, 1624, 1611-1616 included, and the shape of the package lid 1700 may be adapted accordingly. For example, while in FIG. 12 the ribs 1742, 1746 or 1744, 1748 connected to a same island 1732 or 1734 are illustrated as being located substantially at a same level height along the Y direction, the disclosure is not limited thereto. For example, location at different level heights along the Y direction for at least one of the pair of ribs 1742, 1746 and 1744, 1748 as previously described for the package lid 1400 of FIG. 10. Furthermore, while the ribs 1742, 1744, 1746, 1748 are illustrated as extending from the corresponding islands 1732, 1734 to the footing 1720, the disclosure is not limited thereto. In some alternative embodiments, some or all of the ribs 1742, 1744, 1746, 1748 may be connected to the corresponding island 1732 or 1734 and extend towards the footing 1720 without reaching the footing, as illustrated for the package lid 1100 of FIG. 8. In some yet alternative embodiments, some or all of the ribs 1742, 1744, 1746, 1748 may be connected to the footing 1720 and extend towards the corresponding island 1732 or 1734 without reaching the island 1732 or 1734, as illustrated for the package lid 1200 of FIG. 9.

Figure 13:
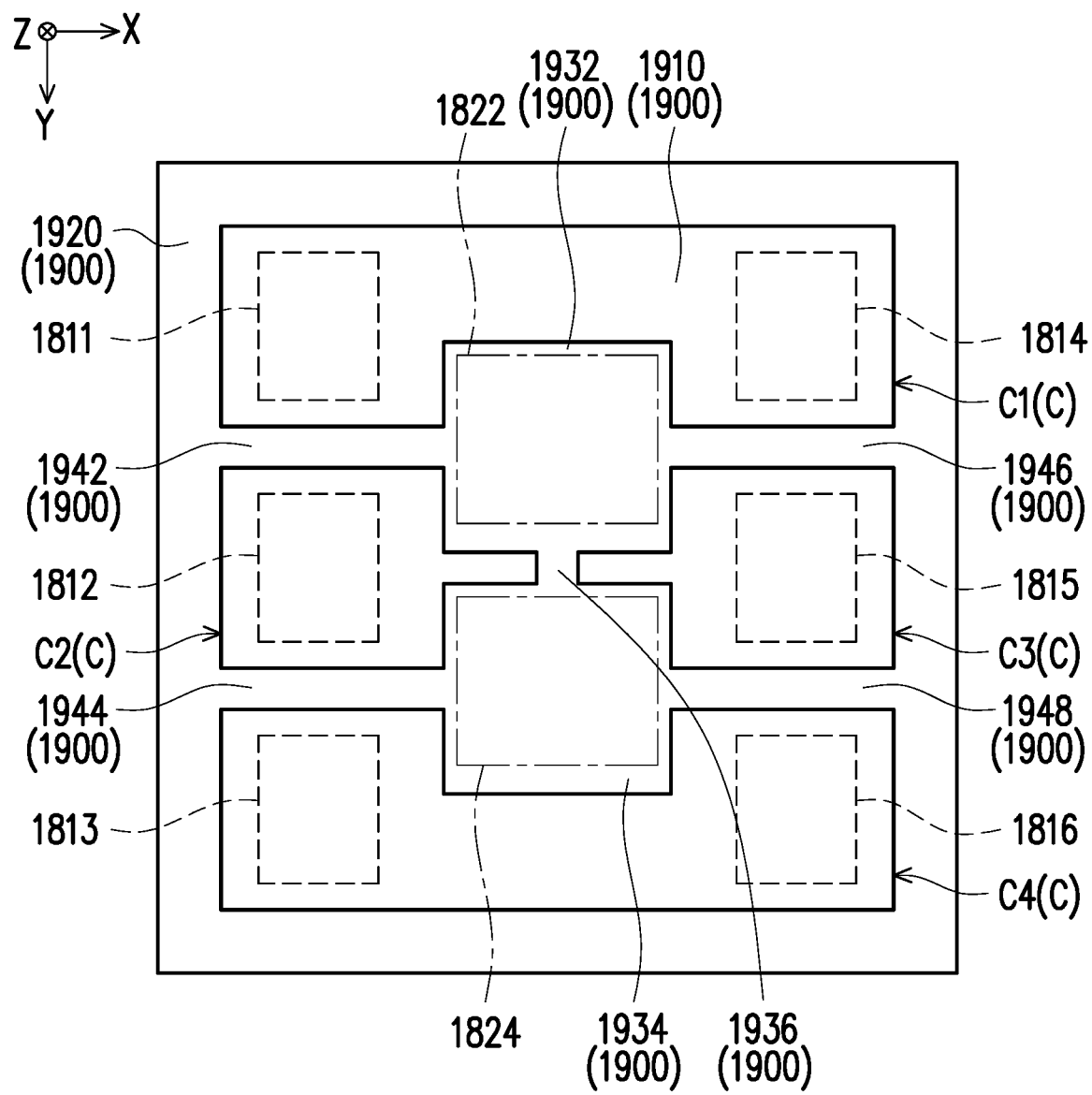

FIG. 13 is a schematic bottom view of a semiconductor device SD24 according to some embodiments of the disclosure. The semiconductor device SD24 may have a similar structure as the semiconductor device SD22 of FIG. 12, and may be fabricated following similar processes as previously described for the semiconductor device SD10 of FIG. 1F. In some embodiments, the semiconductor device SD24 includes semiconductor dies 1811-1816 which may have similar structure and functions as the semiconductor dies 1611-1616 of FIG. 22, and semiconductor dies 1822, 1824 which may have similar structures and functions as the semiconductor dies 1622, 1624 of FIG. 12. For example, the semiconductor dies 1822, 1824 may have higher power consumption during usage than the semiconductor dies 1811-1816. The semiconductor device SD22 further includes a circuit substrate (not illustrated) to which the semiconductor dies 1811-1816, 1822, 1824 are connected, and a package lid 1900 extending over the semiconductor dies 1811-1816, 1822, 1824. The package lid 1900 may be connected to the circuit substrate either directly (as the package lid 1000 of FIG. 7B), or via a support ring (as the package lid 700 of FIG. 1F). In the schematic bottom view of FIG. 13, the positions of the semiconductor dies 1822, 1824 are illustrated as dash-dotted lines, the positions of the semiconductor dies 1811-1816 are illustrated as dashed lines, and the shape of the package lid 1900 is illustrated with thick solid lines.

The package lid 1900 may have a similar structure to the package lid 1700 of FIG. 12, including a roof 1910, a footing 1920 disposed at the edge of the roof 1910 and protruding from the roof 1910 to define a concavity C, and islands 1932, 1934 and ribs 1942, 1944, 1946, 1948 disposed at a central area of the roof 1910 and protruding in a same direction of the footing 1920 from the roof 1910 (e.g., the Z direction). Dimensional relationships between the islands 1932, 1934 and the corresponding semiconductor dies 1822, 1824 as well as the corresponding ribs 1942, 1944, 1946, 1948 may be as previously described with respect to the package lid 700 of FIG. 4A. In some embodiments, a difference between the package lid 1900 of FIG. 13 and the package lid 1700 of FIG. 12 lies in the islands 1932, 1934 being connected by a bridge 1936 protruding from the roof 1910. The bridge 1936 may have a thickness comparable to the islands 1932, 1934, and extend in a direction (e.g., the Y direction) perpendicular to an extending direction of the ribs (e.g., the X direction). In some embodiments, the islands 1932, 1934, the ribs 1942, 1944, 1946, 1948 and the bridge 1936 divide the concavity C in the concavities C1-C4. For example, the island 1932 with the corresponding ribs 1942, 1946 forms on one side along the Y direction the concavity C1, with the footing 1920 forming the concavity C1 at the remaining sides. Similarly, the island 1934 with the corresponding ribs 1944, 1948 forms on one side along the Y direction the concavity C4, with the footing 1920 forming the concavity C4 at the remaining sides. The concavities C2 and C3 are formed at opposite sides along the X direction of the islands 1932, 1934, in between the concavities C1 and C4. The concavity C2 is formed by the footing 1920 on one side along the X direction, and by the islands 1932, 1934, and the bridge 1936 at the opposite side along the X direction, and by the ribs 1942, 1944 along the Y direction. Similarly, the concavity C3 is formed by the footing 1920 on one side along the X direction, and by the islands 1932, 1934, and the bridge 1936 at the opposite side along the X direction, and by the ribs 1946, 1948 along the Y direction. Both the concavities C2 and C3 include a larger area in which the corresponding semiconductor die 1812, 1815 is disposed, and a narrower area protruding from the larger area towards the bridge 1936 in between the islands 1932, 1934.

The disclosure is not limited by the number or shapes of semiconductor dies 1822, 1824, 1811-1816 included, and the shape of the package lid 1900 may be adapted accordingly. For example, while in FIG. 13 the ribs 1942, 1946 or 1944, 1948 connected to a same island 1932, 1934 are illustrated as being located substantially at a same level height along the Y direction, the disclosure is not limited thereto. For example, location at different level heights along the Y direction for at least one of the pair of ribs 1942, 1946 or 1944, 1948 as previously described for the package lid 1400 of FIG. 10 may be possible. Furthermore, while the ribs 1942, 1944, 1946, 1948 are illustrated as extending from the corresponding islands 1932, 1934 to the footing 1920, the disclosure is not limited thereto. In some alternative embodiments, some or all of the ribs 1942, 1944, 1946, 1948 may be connected to the corresponding island 1932 or 1934 and extend towards the footing 1920 without reaching the footing 1920, as illustrated for the package lid 1100 of FIG. 8. In some yet alternative embodiments, some or all of the ribs 1942, 1944, 1946, 1948 may be connected to the footing 1920 and extend towards the corresponding island 1932 or 1934 without reaching the island 1932 or 1934, as illustrated for the package lid 1200 of FIG. 9.

Figure 14:
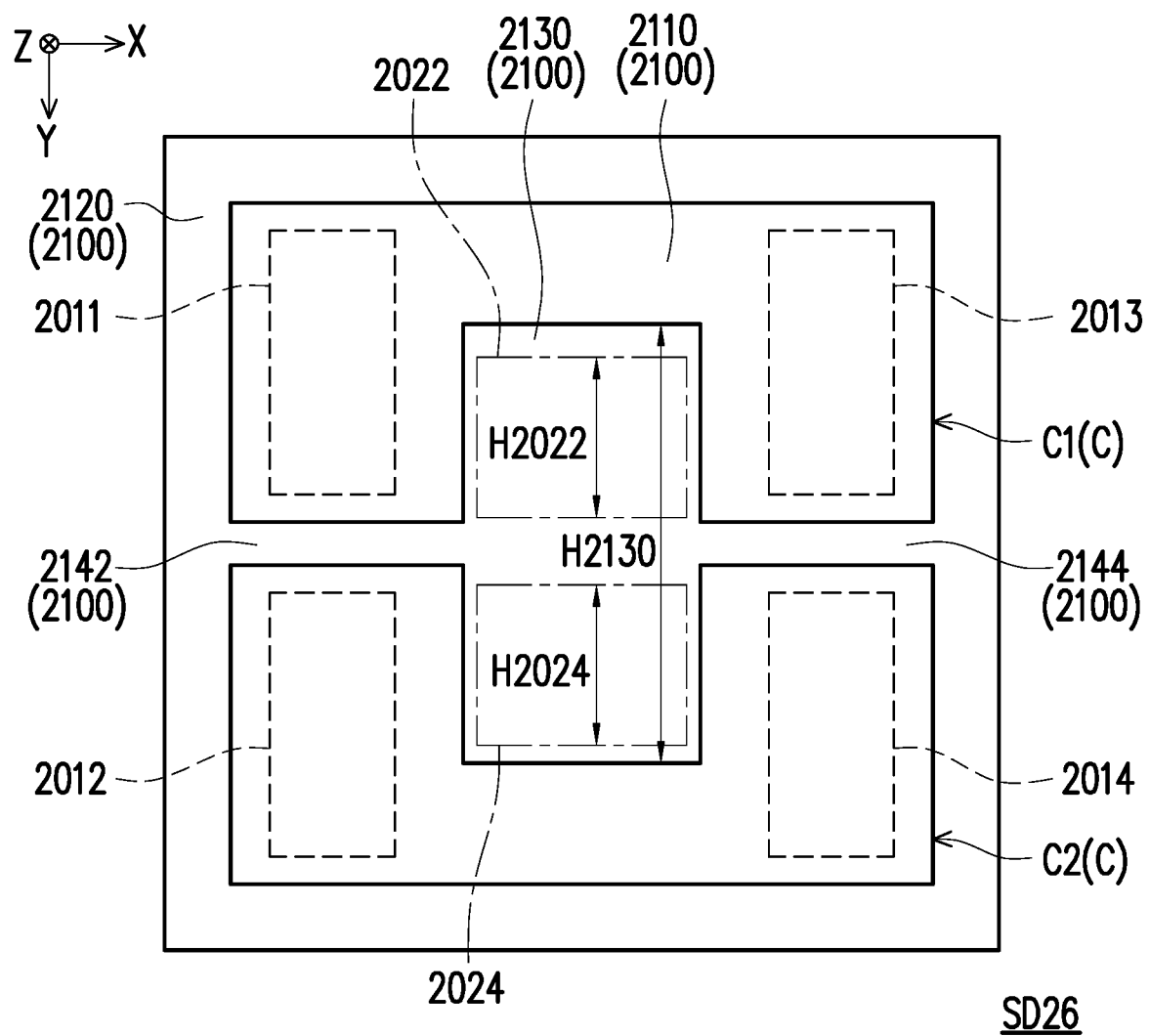

FIG. 14 is a schematic bottom view of a semiconductor device SD26 according to some embodiments of the disclosure. The semiconductor device SD26 may have a similar structure and may be fabricated following similar processes as previously described for the semiconductor device SD10 of FIG. 1F. In some embodiments, the semiconductor device SD26 includes semiconductor dies 2011-2014 which may have similar structure and functions as the semiconductor dies 210 of FIG. 1F, and semiconductor dies 2022, 2024 which may have similar structures and functions as the semiconductor die 220 of FIG. 1F. For example, the semiconductor dies 2022, 2024 may have higher power consumption during usage than the semiconductor dies 2011-2014. The semiconductor device SD26 further includes a circuit substrate (not illustrated) to which the semiconductor dies 2011-2014, 2022, 2024 are connected, and a package lid 2100 extending over the semiconductor dies 2011-2014, 2022, 2024. The package lid 2100 may be connected to the circuit substrate either directly (as the package lid 1000 of FIG. 7B), or via a support ring (as the package lid 700 of FIG. 1F). In the schematic bottom view of FIG. 13, the positions of the semiconductor dies 2022, 2024 are illustrated as dash-dotted lines, the positions of the semiconductor dies 2011-2014 are illustrated as dashed lines, and the shape of the package lid 2100 is illustrated with thick solid lines.

The package lid 2100 may have a similar structure to the package lid 700 of FIG. 4A, including a roof 2110, a footing 2120 disposed at the edge of the roof 2110 and protruding from the roof 2110 to define a concavity C, and an island 2130 and ribs 2142, 2144 disposed at a central area of the roof 2110 and protruding from the roof 2110 in a same direction as the footing 2120 (e.g., the Z direction). In some embodiments, the semiconductor dies 2022, 2024 both contacts the same island 2130. That is, the island 2130 overlays the high-power semiconductor dies 2022, 2024. For example, the height H2130 of the island 2130 may be greater than the summed heights H2022, H2024 of the semiconductor dies 2022, 2024. The ribs 2142, 2144 may extend at opposite sides of the island 2130 along the X direction. Dimensional relationships between the islands 2130 and the ribs 2142, 2144 may be as previously described with respect to the package lid 700 of FIG. 4B. In some embodiments, the island 2130 with the ribs 2142, 2144 divides the concavity C in the concavities C1 and C2. However, the disclosure is not limited thereto. For example, multiple ribs may be connected to the common island 2130, so as to divide the concavity C in a greater number of concavities, as illustrated, e.g., for the package lid 1500 of FIG. 11.

The disclosure is not limited by the number or shapes of semiconductor dies 2022, 2024, 2011-2014 included, and the shape of the package lid 2100 may be adapted accordingly. For example, while in FIG. 14 the ribs 2142, 2144 are illustrated as being located substantially at a same level height along the Y direction, the disclosure is not limited thereto. For example, the ribs 2142, 2144 may be located at different level heights along the Y direction as previously described for the package lid 1400 of FIG. 10 may be possible. Furthermore, while the ribs 2142, 2144 are illustrated as extending from the island 2130 to the footing 2120, the disclosure is not limited thereto. In some alternative embodiments, some or all of the ribs 2142, 2144 may be connected to the island 2130 and extend towards the footing 2120 without reaching the footing 2120, as illustrated for the package lid 1100 of FIG. 8. In some yet alternative embodiments, some or all of the ribs 2142, 2144 may be connected to the footing 2120 and extend towards the island 2130 without reaching the island 2130 as illustrated for the package lid 1200 of FIG. 9.

In some embodiments, by providing a package lid having an island detached from the footing of the package lid along at least one direction, mechanical stress experienced at the level of the adhesive may be effectively reduced. By doing so, delamination during or after package assembly may be reduced or prevented, increasing the manufacturing yield and the reliability of the semiconductor devices. One or more ribs may be included extending between the footing and the island, and connected to one or both of the footing and the island. In some embodiments, the ribs may enhance the rigidity of the lid, which, in turn, may increase the structural stability of the semiconductor device. Therefore, by providing a package lid according to some embodiments of the disclosure, manufacturing yield and package reliability may be further enhanced.

In accordance with some embodiments of the disclosure, a semiconductor device includes a circuit substrate, a first semiconductor die, a thermal interface material, and a package lid. The first semiconductor die is disposed on and is electrically connected to a first side of the circuit substrate. The thermal interface material is disposed on the first semiconductor die at an opposite side of the first semiconductor die with respect to the circuit substrate. The package lid extends over the first semiconductor die and is bonded to the first side of the circuit substrate. The package lid includes a roof, a footing, and an island. The roof extends along a first direction and a second direction perpendicular to the first direction. The footing is disposed at a peripheral edge of the roof and protrudes from the roof towards the circuit substrate along a third direction perpendicular to the first direction and the second direction. The island protrudes from the roof towards the circuit substrate and contacts the thermal interface material on the first semiconductor die. The island is disconnected from the footing along the second direction.

In accordance with some embodiments of the disclosure, a semiconductor device includes a circuit substrate, first semiconductor dies, a second semiconductor die, and a package lid. The first semiconductor dies are connected to a first side of the circuit substrate. The second semiconductor die is connected to the first side of the circuit substrate. The second semiconductor die is connected to the circuit substrate beside the first semiconductor dies. The package lid is disposed on the circuit substrate, and includes a roof, a footing, an island, and ribs. The roof horizontally extends over the circuit substrate along a first direction and a second direction. The footing is shaped as a frame at the edge of the roof and supports the package lid on the circuit substrate. The island protrudes from the roof in correspondence of the second semiconductor die and is entirely separated from the footing along the first direction. The ribs protrude from the roof, and extend between the footing and the island along the second direction. The second semiconductor die is contained within a vertical projection of the island.

In accordance with some embodiments of the disclosure, a manufacturing method of a semiconductor device is provided. The manufacturing method includes the following steps. A first semiconductor die is bonded to a circuit substrate. A first adhesive is disposed on the circuit substrate. The first adhesive encircles the first semiconductor die. A first thermal interface material is disposed on a rear surface of the first semiconductor die. A package lid is adhered to the circuit substrate. The package lid includes a roof, a footing, an island, and ribs. The roof extends parallel to the circuit substrate along a first direction and a second direction perpendicular to the first direction. The footing has a thickness along a third direction perpendicular to the first direction and the second direction greater than a thickness of the roof. The island has a thickness along the third direction greater than the thickness of the roof, and is detached from the footing along the first direction. The ribs have a same thickness as the island along the third direction, and extend along the second direction between the island and the footing. Adhering the package lid to the circuit substrate includes disposing the package lid over the circuit substrate so that the island contacts the first thermal interface material on t the rear surface of the first semiconductor die, and the footing overlies the first adhesive.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a circuit substrate;
a first semiconductor die disposed on and electrically connected to a first side of the circuit substrate;
a thermal interface material, disposed on the first semiconductor die at an opposite side of the first semiconductor die with respect to the circuit substrate; and a package lid, extending over the first semiconductor die and bonded to the first side of the circuit substrate, wherein the package lid comprises:
a roof extending along a first direction and a second direction perpendicular to the first direction;
a footing, disposed at a peripheral edge of the roof and protruding from the roof towards the circuit substrate along a third direction perpendicular to the first direction and the second direction; and
an island, protruding from the roof towards the circuit substrate and contacting the thermal interface material on the first semiconductor die, wherein the island is disconnected from the footing along the second direction, and the island is physically connected to the footing along the first direction.

2. The semiconductor device of claim 1, wherein the first semiconductor die is eccentric with respect to the footing along the second direction.

3. The semiconductor device of claim 1, further comprising second semiconductor dies disposed on and electrically connected to the first side of the circuit substrate beside the first semiconductor die, wherein the footing and the roof form a concavity, and the second semiconductor dies are disposed on the circuit substrate in correspondence of the concavity and physically separated from the roof by a gap.

4. The semiconductor device of claim 1, wherein the package lid further comprises a rib protruding from the roof towards the circuit substrate, and extending along the first direction.

5. The semiconductor device of claim 4, wherein the island is physically connected to the footing by the rib along the first direction, and the rib is physically separated from the footing along the second direction.

6. The semiconductor device of claim 4, wherein the package lid has an elongated shape, with a larger dimension along the first direction and a smaller dimension along the second direction.

7. The semiconductor device of claim 4, wherein the package lid further comprises another rib protruding from the roof towards the circuit substrate and extending along the first direction.

8. The semiconductor device of claim 7, wherein the rib and the other rib are located at opposite sides of the island with respect to the first direction.

9. A semiconductor device, comprising:
a circuit substrate;
first semiconductor dies connected to a first side of the circuit substrate;
a second semiconductor die connected to the first side of the circuit substrate, wherein the second semiconductor die is connected to the circuit substrate beside the first semiconductor dies; and
a package lid, disposed on the circuit substrate and comprising:
a roof, horizontally extending over the circuit substrate along a first direction and a second direction,
a footing, shaped as a frame at the edge of the roof and supporting the package lid on the circuit substrate;
an island, protruding from the roof in correspondence of the second semiconductor die and entirely separated from the footing along the first direction; and
ribs, protruding from the roof, and extending between the footing and the island along the second direction,
wherein the island is physically connected to the footing along the second direction by the rib, and the second semiconductor die is contained within a vertical projection of the island.

10. The semiconductor device of claim 9, further comprising a support ring adhered to the circuit substrate via a first adhesive, wherein the footing is adhered to the support ring via a second adhesive.

11. The semiconductor device of claim 9, further comprising a third semiconductor die connected to the first side of the circuit substrate, wherein the third semiconductor die is disposed beside the second semiconductor die, the second semiconductor die and the third semiconductor die have a higher power consumption than the first semiconductor dies, and the third semiconductor die is contained in a vertical projection of the island.

12. The semiconductor device of claim 9, further comprising a third semiconductor die connected to the first side of the circuit substrate, wherein the third semiconductor die is connected to the area of the circuit substrate beside the second semiconductor die, and the package lid further comprises another island protruding from the roof in correspondence of the third semiconductor die, wherein the third semiconductor die is contained in a vertical projection of the other island.

13. The semiconductor device of claim 12, wherein the package lid further comprises a bridge protruding from the roof, and extending along the first direction to connect the island to the other island.

14. A manufacturing method of a semiconductor device, comprising:
bonding a first semiconductor die to a circuit substrate;
disposing a first adhesive on the circuit substrate, wherein the first adhesive encircles the first semiconductor die;
disposing a first thermal interface material on a rear surface of the first semiconductor die; and
adhering a package lid to the circuit substrate, wherein the package lid comprises:
a roof, extending parallel to the circuit substrate along a first direction and a second direction perpendicular to the first direction;
a footing, having a thickness along a third direction perpendicular to the first direction and the second direction greater than a thickness of the roof;
an island, having a thickness along the third direction greater than the thickness of the roof, and entirely separated from the footing along the first direction; and
ribs, having a same thickness as the island along the third direction, and extending along the second direction between the island and the footing, wherein the island is physically connected to the footing along the second direction by the rib,
wherein adhering the package lid to the circuit substrate comprises disposing the package lid over the circuit substrate so that the island contacts the first thermal interface material on the rear surface of the first semiconductor die and the footing overlies the first adhesive.

15. The manufacturing method of claim 14, wherein adhering the package lid comprises:
adhering a support ring to the first adhesive;
disposing a second adhesive on the support ring; and
adhering the footing to the support ring via the second adhesive.

16. The manufacturing method of claim 14, further comprising bonding second semiconductor dies to the circuit substrate,
wherein the second semiconductor dies are disposed beside the first semiconductor die,
the first adhesive encircles the second semiconductor dies, and the package lid is disposed on the circuit substrate so that at least one rib of the ribs extends in between two adjacent second semiconductor dies.

17. The manufacturing method of claim 16, further comprising disposing a second thermal interface material on rear surfaces of the second semiconductor dies, wherein the package lid is disposed on the circuit substrate so that the roof contacts the second interface material on the rear surfaces of the second semiconductor dies.

18. The manufacturing method of claim 14, wherein the thickness of the footing is greater than the thickness of the island, and the package lid is disposed on the circuit substrate so that the footing contacts the first adhesive.

19. The semiconductor device of claim 1, wherein the package lid further comprises a rib disposed between and physically connected to the island and the footing along the first direction.

20. The semiconductor device of claim 9, wherein the footing and the roof form a plurality of concavities, and the first semiconductor dies are disposed on the circuit substrate in correspondence of the concavities.

\* \* \* \* \*